(12) United States Patent
Iwasaki et al.

(10) Patent No.: US 8,686,467 B2
(45) Date of Patent: Apr. 1, 2014

(54) SEMICONDUCTOR DEVICE COMPRISING SEMICONDUCTOR SUBSTRATE AND HAVING DIODE REGION AND IGBT REGION

(75) Inventors: Shinya Iwasaki, Toyota (JP); Akitaka Soeno, Toyota (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 7 days.

(21) Appl. No.: 13/609,868

(22) Filed: Sep. 11, 2012

(65) Prior Publication Data

US 2013/0001639 A1    Jan. 3, 2013

Related U.S. Application Data

(63) Continuation of application No. PCT/JP2010/056094, filed on Apr. 2, 2010.

(51) Int. Cl.
*H01L 29/739* (2006.01)
*H01L 21/331* (2006.01)

(52) U.S. Cl.
USPC .......................................... 257/140; 438/135

(58) Field of Classification Search
CPC ............................ H01L 29/739; H01L 21/331
USPC ............. 257/140, E21.382, E29.197; 438/135
See application file for complete search history.

(56) References Cited

U.S. PATENT DOCUMENTS

| | | | |
|---|---|---|---|
| 5,969,400 A | 10/1999 | Shinohe et al. | |
| 6,180,966 B1 * | 1/2001 | Kohno et al. | 257/173 |
| 6,323,509 B1 | 11/2001 | Kusunoki | |
| 6,605,830 B1 | 8/2003 | Kusunoki | |
| 2005/0212057 A1 | 9/2005 | Tokuda et al. | |
| 2008/0093697 A1 | 4/2008 | Kaneda et al. | |
| 2009/0068815 A1 | 3/2009 | Tokuda et al. | |
| 2009/0114946 A1 | 5/2009 | Ueno | |
| 2012/0007142 A1 | 1/2012 | Nagaoka et al. | |

FOREIGN PATENT DOCUMENTS

| | | |
|---|---|---|
| JP | 03-105977 A | 5/1991 |
| JP | 06-260499 A | 9/1994 |
| JP | 08-316480 A | 11/1996 |
| JP | 09-326495 A | 12/1997 |
| JP | 2000-200906 A | 7/2000 |
| JP | 2005-142288 A | 6/2005 |
| JP | 2006-093520 A | 4/2006 |
| JP | 2008-103590 A | 5/2008 |
| JP | 2008-192737 A | 8/2008 |
| JP | 2009-105265 A | 5/2009 |
| WO | 2004/109808 A1 | 12/2004 |

OTHER PUBLICATIONS

International Search Report mailed Jun. 29, 2010 of PCT/JP2010/056094.
Nov. 29, 2012, International Preliminary Report on Patentability with translation of Written Opinion of PCT/JP20101056094.

* cited by examiner

*Primary Examiner* — Walter H Swanson
(74) *Attorney, Agent, or Firm* — Kenyon & Kenyon LLP

(57) ABSTRACT

A semiconductor device includes a semiconductor substrate in which a diode region and an IGBT region are formed, wherein a lower surface side of the semiconductor substrate comprises a low impurity region provided between a second conductivity type cathode region of the diode region and a first conductivity type collector region of the IGBT region. The low impurity region includes at least one of a first conductivity type first low impurity region which has a lower density of first conductivity type impurities than that in the collector region and a second conductivity type second low impurity region which has a lower density of second conductivity type impurities than that in the cathode region.

10 Claims, 19 Drawing Sheets

US 8,686,467 B2

SEMICONDUCTOR DEVICE COMPRISING SEMICONDUCTOR SUBSTRATE AND HAVING DIODE REGION AND IGBT REGION

CROSS-REFERENCE TO RELATED APPLICATION

This application is a continuation of PCT application PCT/JP2010/056094 filed on Apr. 2, 2010 designating the United States of America, the entire contents of which are incorporated by reference herein.

TECHNICAL FIELD

The techniques described in the present specification relate to a semiconductor device comprising a semiconductor substrate in which a diode region and an IGBT region are formed.

DESCRIPTION OF RELATED ART

Japanese Patent Application Publication No. 2008-192737 discloses a semiconductor device comprising a semiconductor substrate in which a diode region and an IGBT region are formed. A lower surface side of the semiconductor substrate forms an n-type cathode layer in the diode region and a p-type collector layer in the IGBT region. The cathode layer and the collector layer are in contact with each other and a boundary therebetween exists within a boundary region between the diode region and the IGBT region.

Carriers may sometimes be transferred between the IGBT region and the diode region in a vicinity of the boundary between the IGBT region and the diode region. For example, carriers are transferred from the IGBT region to the diode region during an IGBT operation. As a result, carrier density in a drift region of the IGBT region decreases, resistance of the drift region increases and, consequently, on-voltage during the IGBT operation increases. In addition, switching the IGBT region to an on-state when a return current is flowing through the diode region causes a reverse recovery current to flow through the diode region. During such a reverse recovery of a diode, the carriers are transferred from the IGBT region to the diode region. As a result, the reverse recovery current of the diode increases and makes the diode more susceptible to element destruction.

The present specification provides a semiconductor device comprising a semiconductor substrate in which a diode region and an IGBT region are formed, the semiconductor device capable of suppressing carrier transfer between the IGBT region and the diode region, suppressing an increase in on-voltage during an IGBT operation, and improving recovery characteristics of a diode.

SUMMARY

The present specification provides a semiconductor device comprising a semiconductor substrate in which a diode region and an IGBT region are formed. In the semiconductor device, the diode region comprises a first conductivity type anode region exposed at an upper surface of the semiconductor substrate, a second conductivity type diode drill region formed on a lower surface side of the anode region, and a second conductivity type cathode region which has a higher density of second conductivity type impurities than in the diode drift region and which is formed on a lower surface side of the diode drift region. The IGBT region comprises a second conductivity type emitter region exposed at the upper surface of the semiconductor substrate, a first conductivity type body region which is formed at a side and a lower surface side of the emitter region and which is in contact with an emitter electrode, a second conductivity type IGBT drift region formed on a lower surface side of the body region, a first conductivity type collector region formed on a lower surface side of the IGBT drift region, and a gate electrode facing a range of the body region via an insulating film, wherein the range of the body region separates the emitter region from the IGBT drift region. A low impurity region is formed between the cathode region and the collector region at a lower surface of the semiconductor substrate. The low impurity region comprises at least one of a first conductivity type first low impurity region which has a lower density of first conductivity type impurities than that in the collector region and a second conductivity type second low impurity region which has a lower density of second conductivity type impurities than that in the cathode region.

According to the configuration described above, the low impurity region whose electrical resistance is higher than both of the cathode region and the collector region is formed between the cathode region and the collector region. Since carriers are less likely to flow into the low impurity region with the high resistance, carrier density decreases in a region above the low impurity region of the semiconductor substrate. As a result, the carrier density between the diode region and the IGBT region can be reduced. Accordingly, carrier transfer between the IGBT region and the diode region can be suppressed, an increase in on-voltage during an IGBT operation can be suppressed, and recovery characteristics of the diode can be improved.

DETAILED DESCRIPTION OF EMBODIMENT (Semiconductor Device)

Figure 1:
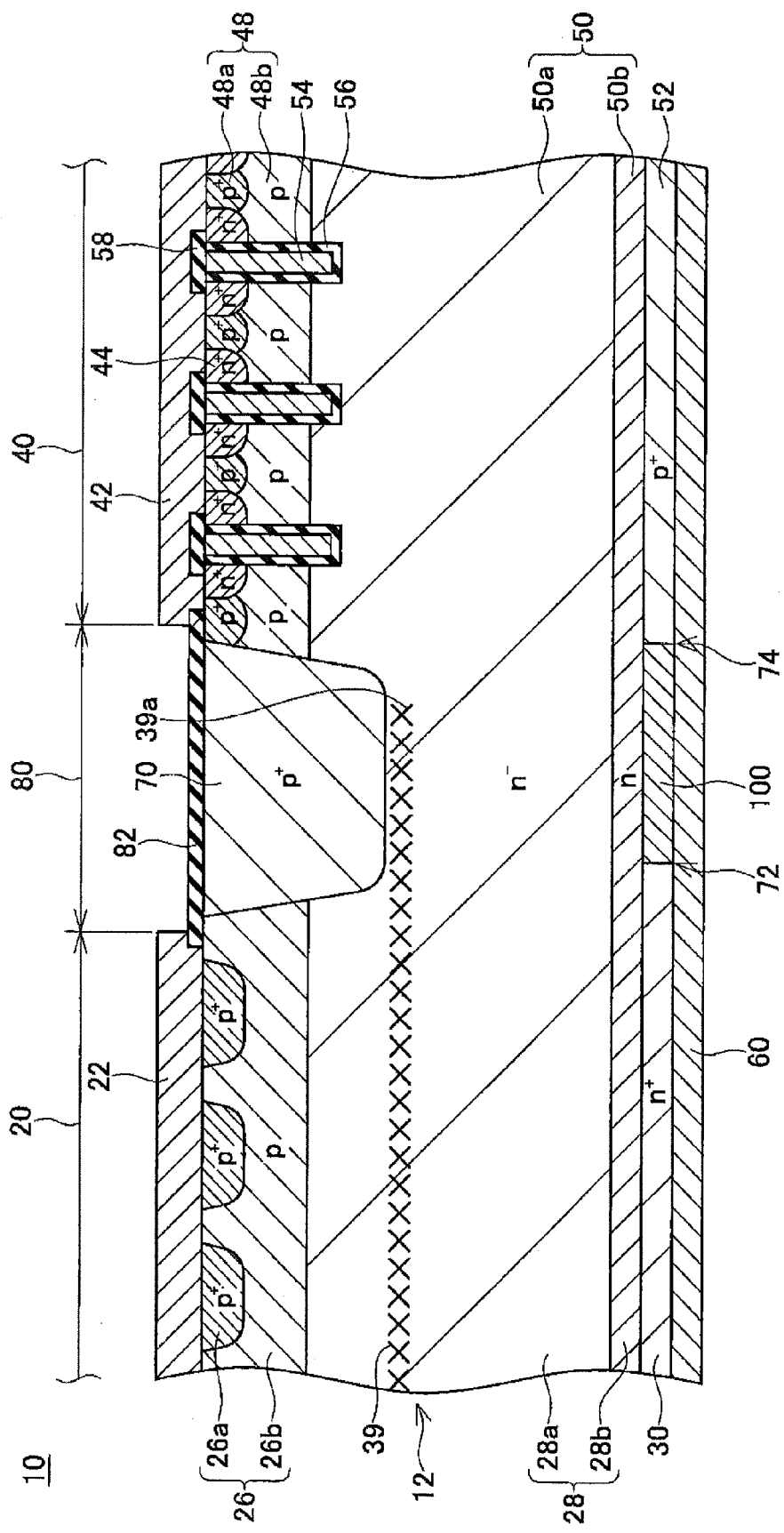
FIG. 1 is a cross-sectional view of a semiconductor device according to an embodiment.

A semiconductor device according to an embodiment disclosed by the present specification will now be described. As shown in FIG. 1, a semiconductor device 10 according to the present embodiment comprises a semiconductor substrate 12, and a metallic layer, an insulating film and the like formed on an upper surface and a lower surface of the semiconductor substrate 12. A diode region 20, an IGBT region 40, and a boundary region 80 are formed on the semiconductor substrate 12. The boundary region 80 is formed between the diode region 20 and the IGBT region 40.

An anode electrode 22 is formed on an upper surface of the semiconductor substrate 12 in the diode region 20. An emitter electrode 42 is formed on an upper surface of the semiconductor substrate 12 in the IGBT region 40. A common electrode 60 is formed on a lower surface of the semiconductor substrate 12.

An anode layer 26, a diode drift layer 28, and a cathode layer 30 are formed in the diode region 20.

The anode layer 26 is a p-type layer. The anode layer 26 comprises an anode contact region 26a and a low impurity anode layer 26b. The anode contact region 26a is formed in an island shape in a range exposed at the upper surface of the semiconductor substrate 12. The anode contact region 26a has a high impurity density. The anode contact region 26a is ohmically connected to the anode electrode 22. The low impurity anode layer 26b is formed on a lower side and on a side of the anode contact region 26a and covers the anode contact region 26a. The low impurity anode layer 26b has a lower impurity density than the anode contact region 26a.

The diode drift layer 28 is formed on a lower side of the anode layer 26. The diode drift layer 28 is an n-type drift layer. The diode drift layer 28 comprises an upper drift layer 28a and a lower drift layer 28b. The upper drift layer 28a has a lower impurity density than the lower drift layer 28b.

The cathode layer 30 is formed on a lower side of the diode drift layer 28. The cathode layer 30 is formed in a range exposed at the lower surface of the semiconductor substrate 12. The cathode layer 30 is an n-type cathode layer and has a high impurity density. The cathode layer 30 is ohmically connected to the common electrode 60.

The anode layer 26, the diode drift layer 28, and the cathode layer 30 form a diode.

An emitter region 44, a body layer 48, an IGBT drift layer 50, a collector layer 52, and a gate electrode 54 and the like are formed in the IGBT region 40.

A plurality of trenches is formed on an upper surface of the semiconductor substrate 12 in the IGBT region 40. A gate insulating film 56 is formed on an inner surface of each trench. A gate electrode 54 is formed inside each trench. An upper surface of the gate electrode 54 is covered by an insulating film 58. The gate electrode 54 is insulated from the emitter electrode 42.

The emitter region 44 is formed in an island shape in a range exposed at the upper surface of the semiconductor substrate 12. The emitter region 44 is formed in a range adjacent to the gate insulating film 56. The emitter region 44 is an n-type emitter region and has a high impurity density. The emitter region 44 is ohmically connected to the emitter electrode 42.

The body layer 48 is a p-type body layer. The body layer 48 comprises a body contact region 48a and a low impurity body layer 48b. The body contact region 48a is formed in an island shape in a range exposed at the upper surface of the semiconductor substrate 12. The body contact region 48a is formed between two emitter regions 44. The body contact region 48a has a high impurity density. The body contact region 48a is ohmically connected to the emitter electrode 42. The low impurity body layer 48b is formed on a lower side of the emitter region 44 and the body contact region 48a. The low impurity body layer 48b is formed in a range shallower than a lower end of the gate electrode 54. The low impurity body layer 48b has a lower impurity density than the body contact region 48a. The low impurity body layer 48b separates the emitter region 44 from the IGBT drift layer 50. The gate electrode 54 faces the low impurity body layer 48b via the gate insulating film 56 in a range in which the emitter region 44 and the IGBT drift layer 50 are separated from each other.

The IGBT drift layer 50 is formed on a lower side of the body layer 48. The IGBT drift layer 50 is an n-type drift layer. The IGBT drift layer 50 comprises a drift layer 50a and a buffer layer 50b. The drift layer 50a is formed on a lower side of the body layer 48. The drift layer 50a has a low impurity density. The drift layer 50a has an impurity density that is approximately the same as that of the upper drift layer 28a of the diode region 20 and is a layer continuous to the upper drift layer 28a. The buffer layer 50b is formed on a lower side of the drift layer 50a. The buffer layer 50b has a higher impurity density than the drift layer 50a. The buffer layer 50b has an impurity density that is approximately the same as that of the lower drift layer 28b of the diode region 20 and is a layer continuous to the lower drift layer 28b.

The collector layer 52 is formed on a lower side of the IGBT drift layer 50. The collector layer 52 is formed in a range exposed at the lower surface of the semiconductor substrate 12. The collector layer 52 is a p-type collector layer and has a high impurity density. The collector layer 52 is ohmically connected to the common electrode 60.

The emitter region 44, the body layer 48, the IGBT drift layer 50, the collector layer 52, and the gate electrode 54 form an IGBT.

The boundary region 80 is formed between the diode region 20 and the IGBT region 40. A boundary region is an inactive region in which a device structure is not formed. An upper surface of the boundary region 80 is not in contact with an electrode. An insulating film 82 is formed on the upper surface of the boundary region 80. A separation region 70 is formed in the boundary region 80. The separation region 70 is formed in a range extending from the upper surface of the semiconductor substrate 12 to a position deeper than both of a lower end of the anode layer 26 and a lower end of the body layer 48. More specifically, the separation region 70 is formed in a range extending from the upper surface of the semiconductor substrate 12 to a position deeper than a lower end of the gate electrode 54. The separation region 70 is in contact with the anode layer 26 and the body layer 48. The separation region 70 is a p-type region. The separation region 70 has an impurity density that is higher than both of that of the low impurity anode layer 26b and that of the low impurity body layer 48b. The separation region 70 has a flat bottom surface. The separation region 70 suppresses concentration of an electric field between the anode layer 26 and the body layer 48. In particular, since the separation region 70 is formed to a position deeper than the lower end of the gate electrode 54, concentration of an electric field at the gate electrode 54 in a vicinity of the separation region 70 is suppressed.

The upper drift layer 28a and the drift layer 50a are continuous with each other on a lower side of the separation region 70. The lower drift layer 28b and the buffer layer 50b are continuous with each other on a lower side of the continuous upper drift layer 28a and the drift layer 50a. The lower drift layer 28b and the buffer layer 50b are continuous with each other on an upper side of a low impurity layer 100. The low impurity layer 100 is formed between the cathode layer 30 and the collector layer 52. The low impurity layer 100 is an n-type layer and has a lower impurity density than the cathode layer 30. An electrical resistance of the low impurity layer 100 is higher than both of that of the cathode layer 30 and that of the collector layer 52.

In a same manner as the cathode layer 30 and the collector layer 52, the low impurity layer 100 is formed in a range exposed at a lower surface of the semiconductor substrate 12 and is ohmically connected to the common electrode 60. Due to a low impurity density, a contact resistance of the low impurity layer 100 and the common electrode 60 is higher than both of a contact resistance of the cathode layer 30 and the common electrode 60 and a contact resistance of the collector layer 52 and the common electrode.

The cathode layer 30 of the diode region 20 extends to a lower side of the separation region 70 and is adjacent to the low impurity layer 100 on the lower side of the separation region 70. The low impurity layer 100 extends to a boundary between the IGBT region 40 and the boundary region 80 and is adjacent to the collector layer 52 of the IGBT region 40. In other words, a boundary 72 between the cathode layer 30 and the low impurity layer 100 is located on a side that is closer to the diode region 20 than a position under the body layer 48 of the IGBT region 40 in a plan view of the semiconductor device 10. More specifically, the boundary 72 is positioned on a lower side of a bottom surface (flat portion) of the separation region 70. The boundary 74 between the collector layer 52 and the low impurity layer 100 is positioned on a lower side of an inclined part of the separation region 70 and, at the same time, positioned under the body layer 48 of the IGBT region 40.

A carrier lifetime control region 39 is formed in the upper drift layer 28a of the diode drift layer 28. A crystal defect formed by irradiating charged particles to the semiconductor substrate 12 exists in the carrier lifetime control region 39. A crystal defect density in the carrier lifetime control region 39 is significantly higher than the upper drift layer 28a surrounding the carrier lifetime control region 39. The carrier lifetime control region 39 is formed at a depth which is in a vicinity of the anode layer 26 and which is deeper than a lower end of the separation region 70. In addition, the carrier lifetime control region 39 extends from the diode region 20 to within the boundary region 80 and does not penetrate into the IGBT region 40.

Reference sign 39a denotes an end of the carrier lifetime control region 39 on a side of the IGBT region 40. The end 39a of the carrier lifetime control region 39 is positioned inside the boundary region 80 and on a lower side of the separation region 70. More specifically, the end 39a is positioned on a lower side of a bottom surface (flat portion) of the separation region 70. In addition, the end 39a is positioned on an upper side of the low impurity layer 100.

A structure of the boundary region 80 shown in FIG. 1 is extended between the diode region 20 and the IGBT region 40. In other words, the low impurity layer 100, the boundary 72, the boundary 74, and the end 39a of the carrier lifetime control region 39 extend along the separation region 70 between the diode region 20 and the IGBT region 40.

(Operation of IGBT of Semiconductor Device)

An operation of the IGBT of the semiconductor device 10 will now be described. When a voltage that positively charges the common electrode 60 is applied between the emitter electrode 42 and the common electrode 60 and an on-potential (a potential equal to or greater than a potential necessary for a formation of a channel) is applied to the gate electrode 54, the IGBT turns on. In other words, the application of the on-potential to the gate electrode 54 causes a channel to be formed on the low impurity body layer 48b in a range that is in contact with the gate insulating film 56. As a result, electrons flow from the emitter electrode 42 via the emitter region 44, the channel, the IGBT drift layer 50, and the collector layer 52 into the common electrode 60. In addition, holes flow from the common electrode 60 via the collector layer 52, the IGBT drift layer 50, the low impurity body layer 48b, and the body contact region 48a into the emitter electrode 42. In other words, a current flows from the common electrode 60 to the emitter electrode 42. Electrons and holes flow into the IGBT drift layer 50 and, due to conductivity modulation, resistance decreases. Accordingly, on-voltage during the IGBT operation decreases.

As holes on a side of the IGBT drift layer 50 pass under the separation region 70 of the boundary region 80 and migrate to the diode drift layer 28, a hole density of the IGBT drift layer 50 decreases to inhibit conductivity modulation of the IGBT region 40, and causes an increase in IGBT on-voltage.

However, the low impurity layer 100 is formed under the separation region 70 in the semiconductor device 10. Since the low impurity layer 100 has a higher electrical resistance than the cathode layer 30 and the collector layer 52 and has a high contact resistance with the common electrode 60, carrier transfer is unlikely to occur between the semiconductor substrate 12 and the common electrode 60 via the low impurity layer 100. As a result, carrier density decreases in the semiconductor substrate 12 on an upper side of the low impurity layer 100. Therefore, holes supplied to the IGBT drift layer 50 are suppressed from migrating to a side of the boundary region 80 and flowing into the low impurity layer 100. In addition, since the low impurity layer 100 exists between the collector layer 52 and the cathode layer 30 and increases a distance from the IGBT drift layer 50 to the cathode layer 30, holes supplied to the IGBT drift layer 50 are suppressed from migrating toward the cathode layer 30. In this manner, since holes are suppressed from migrating from the IGBT region 40 to the diode region 20, an increase in on-voltage during an IGBT operation is suppressed.

(Operation of Diode of Semiconductor Device)

When a potential applied to the gate electrode 54 is switched from the on-potential to the off-potential, the IGBT is turned off. In addition, the diode of the semiconductor device 10 is turned on. In other words, when a voltage (i.e., a forward voltage) that positively charges the anode electrode 22 is applied between the anode electrode 22 and the common electrode 60, the diode is turned on. Accordingly, a current flows from the anode electrode 22 via the anode layer 26, the diode drift layer 28, and the cathode layer 30 into the common electrode 60.

When the diode is turned on, a portion of the body layer 48 of the IGBT region 40 that is close to the diode region 20, the IGBT drift layer 50, and a portion of the cathode layer 30 of the diode region 20 that is close to the IGBT region 40 sometimes operate as a parasitic diode. In this case, carriers injected from a side of the body layer 48 to the IGBT drift layer 50 (i.e., holes in the case of the semiconductor device 10) migrate toward the cathode layer 30 via the drift layer in the boundary region. As a result, the carriers accumulate in the drift layer in the boundary region 80.

Furthermore, when the carrier lifetime control region 39 is formed on the diode drift layer 28, a forward voltage of the diode region 20 increases. As a result, the parasitic diode described above becomes easily operable when the diode is turned on. When the parasitic diode operates, the carriers that migrate from the side of the IGBT drift layer 50 to the side of the boundary region 80 increases and an effect of reducing a carrier density of the drift layer of the boundary region 80 cannot be sufficiently obtained even though the carrier lifetime control region 39 is formed.

However, with the semiconductor device 10 according to FIG. 1, the low impurity layer 100 is formed under the separation region 70 of the boundary region 80. Since the low impurity layer 100 has the higher electrical resistance than the cathode layer 30 and the collector layer 52 and the high contact resistance with the common electrode 60, the parasitic diode described above becomes less operable. In other words, carriers are less likely to accumulate in the drift layer of the boundary region 80.

Next, when the voltage applied to the diode is switched from the forward voltage to the reverse voltage, the diode performs the reverse recovery operation. In other words, holes existing in the diode drift layer 28 when the forward voltage is being applied are discharged to the anode electrode 22 and electrons existing in the diode drift layer 28 when the forward voltage is being applied are discharged to the common electrode 60.

Carriers sometimes accumulate in the IGBT drift layer 50 of the boundary region 80. When the volume of the carriers accumulated in the IGBT drift layer 50 of the boundary region 80 becomes significant, the reverse recovery current increases and the recovery characteristics of the diode decrease.

As already described, since the low impurity layer 100 is formed under the separation region 70, carriers are suppressed from accumulating in the IGBT drift layer 50 of the boundary region 80 when the diode is turned on. As a result, an increase of the reverse recovery current is suppressed. In other words, a reduction in the recovery characteristics of the diode is suppressed.

In addition, the carrier lifetime control region 39 is formed on the diode drift layer 28. A crystal defect in the carrier lifetime control region 39 functions as a carrier recombination center. Therefore, during the reverse recovery operation, a major portion of the carriers in the diode drift layer 28 becomes extinct due to recombination in the carrier lifetime control region 39. Consequently, the reverse recovery current that occurs during the reverse recovery operation is suppressed in the semiconductor device 10.

Furthermore, in the semiconductor device 10, the carrier lifetime control region 39 extends to a lower side of the separation region 70. Therefore, carriers existing in the diode drift layer 28 on the lower side of the separation region 70 recombine in the carrier lifetime control region 39. As a result, a high current is prevented from being generated in a vicinity of the separation region 70 during a reverse recovery operation.

As described above, the semiconductor device 10 according to the present embodiment is provided with the low impurity layer 100 between the collector layer 52 and the cathode layer 30. Accordingly, an effect can be obtained in which an increase in on-voltage is suppressed during an IGBT operation. In addition, an effect can be obtained in which the operation of the parasitic diode (comprised by a portion close to the diode region 20 among the body layer 48 of the IGBT region 40, the IGBT drift layer 50, and the portion close to the IGBT region 40 among the cathode layer 30 of the diode region 20) is suppressed during the diode operation and the recovery characteristics during the diode reverse recovery are improved.

Furthermore, since the parasitic diode is less likely to become operable even if the existence of the carrier lifetime control region 39 causes an increase of the forward voltage of the diode region 20, an effect in which the carrier lifetime control region attenuates the carriers can be sufficiently obtained, which is effective for improving the recovery characteristics of the diode.

Moreover, in the semiconductor device 10, the end 39a of the carrier lifetime control region 39 is positioned under the separation region 70. Even if a manufacturing error causes a deviation of the position of the end 39a (the position in a width direction (a left-right direction in FIG. 1) of the separation region 70) under the separation region 70, an area of the carrier lifetime control region 39 in the diode region 20 remains unchanged. In addition, as described above, a low current flows through the diode drift layer 28 under the separation region 70. Therefore, even if the deviation of the position of the end 39a causes a change in the characteristics of the diode drift layer 28 under the separation region 70, the influence on the reverse recovery characteristics of the diode is small. As a result, the reverse recovery characteristics of the diode of the semiconductor device 10 are less likely to fluctuate even if the position of the end 39a deviates. In other words, the reverse recovery characteristics of the diode are unlikely to vary during mass production of the semiconductor device 10.

(Method for Manufacturing Semiconductor Device)

Next, a method for manufacturing the semiconductor device 10 will be described. The semiconductor device 10 according to FIG. 1 is manufactured by forming a plurality of element structures, each of which configuring the semiconductor device 10, on a semiconductor wafer and then separating the respective semiconductor devices by dicing. First to third methods for manufacturing the element structure of the semiconductor device 10 on a semiconductor wafer will now be described.

(First Manufacturing Method)

A first method for manufacturing the semiconductor device 10 comprises a masking step, a crystal defect forming step, an ion doping step, and an annealing step.

In the masking step, a mask is disposed on a lower surface side of an IGBT forming region (a region in which a IGBT region of the semiconductor device is formed) of the semiconductor wafer. A material of the mask need only be capable of blocking charged particles and impurity ions, and silicon (Si) or the like can be favorably used.

In the crystal defect forming step, charged particles (ions, neutrons, an electron beam, and the like) are irradiated from a lower surface side of the mask to a lower surface of the semiconductor wafer and a crystal defect is formed in the diode drift layer 28 of the semiconductor wafer. As necessary, charged particles may be irradiated via an energy absorber made of aluminum or the like.

In the ion doping step, impurity ions with a conductivity type opposite to that of a side in which the mask is disposed are doped over a plurality of times to the lower surface of the semiconductor wafer to form an ion doping region. For example, p-type impurity ions are doped when the mask is disposed on a lower surface side of the diode forming region (a region in which a diode region of a semiconductor device is formed). N-type impurity ions are doped when the mask is disposed on a lower surface side of the IGBT forming region. The plurality of ion doping steps comprises a first ion doping step of doping the ions in a first direction from a side of a region in which the mask has been formed to a side of a region in which the mask was not formed, the first direction making an acute angle with the lower surface of the semiconductor wafer, and a second ion doping step of doping the ions in a second direction which intersects with the first direction. When the mask is disposed on the lower surface side of the diode forming region, the first direction is the direction that makes the acute angle with the lower surface of the semiconductor wafer from the side of the IGBT forming region to the side of the diode forming region. When the mask is disposed on the lower surface side of the IGBT forming region, the first direction is the direction that makes the acute angle with the lower surface of the semiconductor wafer from the side of the diode forming region to the side of the IGBT forming region. Any of the first ion doping step and the second ion doping step may be performed first and, consequently, a low ion doping region can be formed between the diode forming region and the IGBT forming region. In the annealing step, annealing of the ion doping region and the low ion doping region is performed.

The mask disposed in the masking step may be used both as a mask for blocking first conductivity type impurity ions in the ion doping step and a mask for blocking charged particles in the crystal defect forming step.

The first manufacturing method will now be described more specifically as a first example with reference to FIGS. 2 to 8 which illustrate the method for manufacturing the semiconductor device according to the present embodiment.

FIRST EXAMPLE

Figure 2:
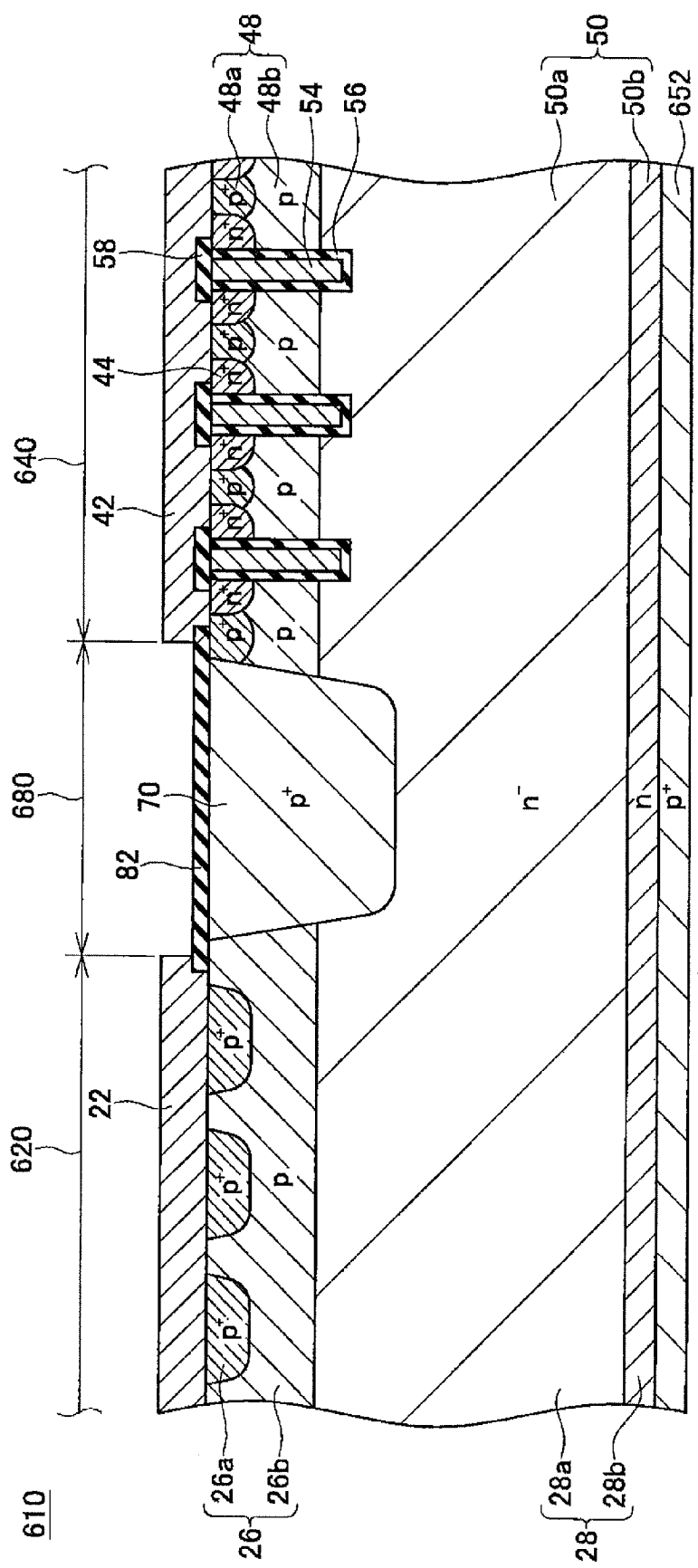
FIG. 2 is diagram illustrating a method for manufacturing a semiconductor device according to a first practical example.

FIG. 2 is a diagram showing a cross section of a portion of the semiconductor wafer according to the first method for manufacturing the semiconductor device 10. A wafer 610 shown in FIG. 2 illustrates a state before the carrier lifetime control region 39, the cathode layer 30, the low impurity layer 100, and the common electrode 60 of the semiconductor device 10 are formed. Other components of the semiconductor device 10 have already been formed. A p-type collector layer 652 is formed on a lower surface side of the wafer 610. In the wafer 610, a diode forming region 620 denotes a region that becomes the diode region 20 of the semiconductor device 10 shown in FIG. 1 after a manufacturing step is completed, an IGBT forming region 640 denotes a region that becomes the IGBT region 40 of the semiconductor device 10 shown in FIG. 1 after the manufacturing step is completed, and a boundary forming region 680 denotes a region that becomes the boundary region 80 of the semiconductor device 10 shown in FIG. 1 after the manufacturing step is completed. Components similar to those of the semiconductor device 10 shown in FIG. 1 are denoted by the same reference numerals. In the respective steps of the first manufacturing method, the carrier lifetime control region 39, the cathode layer 30, and the low impurity layer 100 of the semiconductor device 10 are formed.

Figure 3:
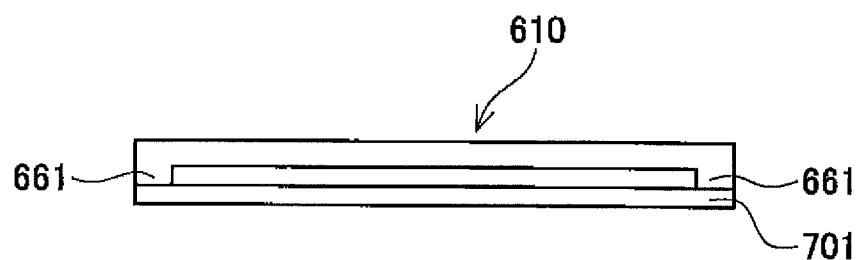
FIG. 3 is diagram illustrating the method for manufacturing the semiconductor device according to the first practical example.
Figure 4:
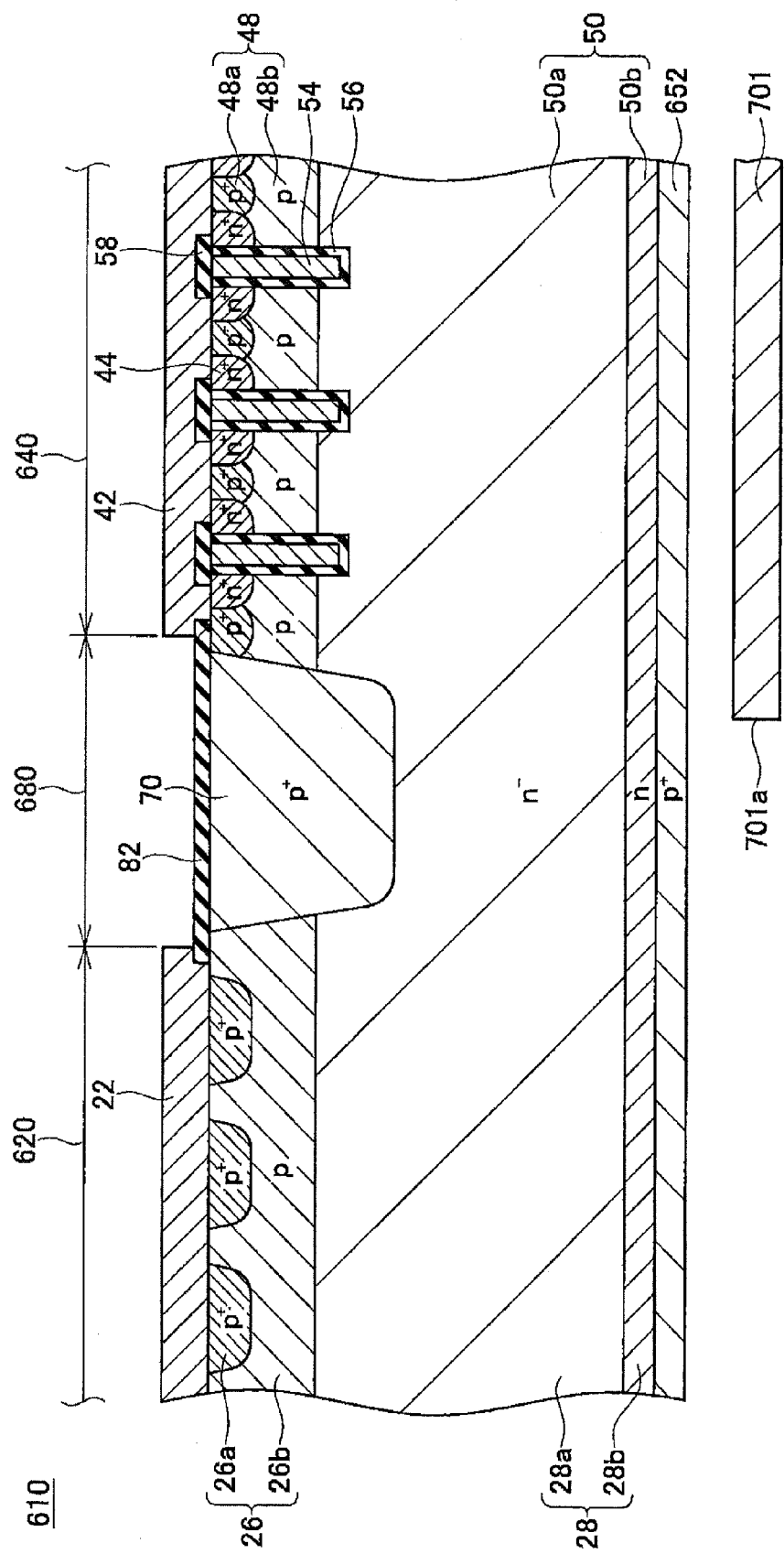
FIG. 4 is diagram illustrating the method for manufacturing the semiconductor device according to the first practical example.

In the masking step, as shown in FIG. 3, a mask 701 is disposed on a lower surface side of the IGBT forming region of the wafer 610. The mask 701 is used as a mask for blocking first conductivity type impurity ions in the ion doping step and a mask for blocking charged particles in the crystal defect forming step. As shown in FIG. 3, a rib 661 is provided in a peripheral part of the wafer 610 and the element structure shown in FIG. 2 is formed in an element forming region on an inner side of the rib 661. By fixing the flat-plate mask 701 to the rib 661, the element forming region of the wafer 610 and the mask 701 can be fixed in a state where the element forming region of the wafer 610 and the mask 701 are separated from each other. Although not shown in FIG. 3, the mask 701 is opened at a position that becomes under a region in which a crystal defect is to be formed in the wafer 610. FIG. 4 is a diagram in which a same cross section as FIG. 2 shows the wafer 610 in a state where the mask 701 is installed. As shown in FIG. 4, the mask 701 is opened at a part of the diode forming region 620 and the boundary forming region 680 which form the carrier lifetime control region 39. A position of an end 701a of the mask 701 is adjusted to be aligned with an end 39a of the carrier lifetime control region 39.

Figure 5:
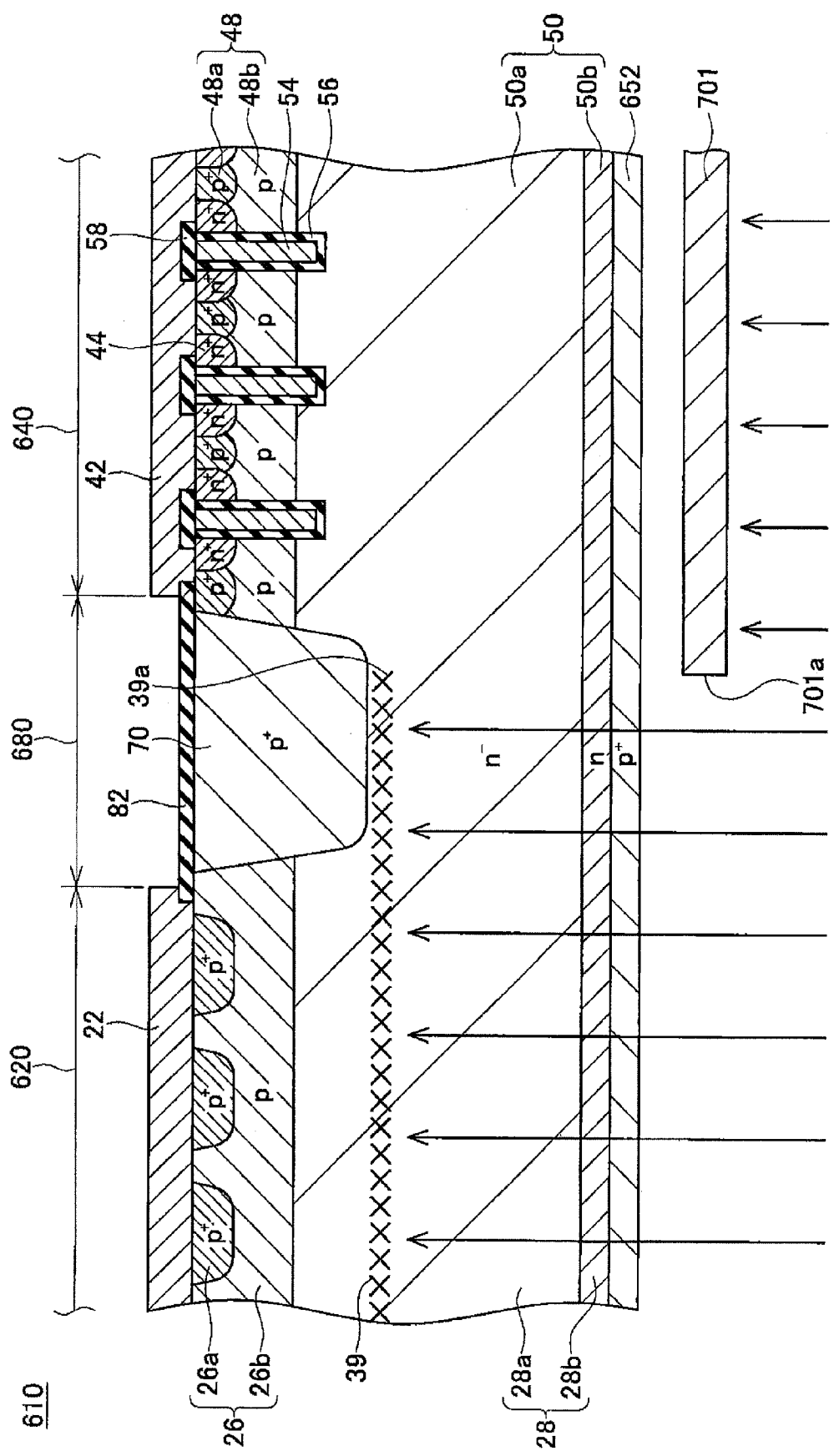
FIG. 5 is diagram illustrating the method for manufacturing the semiconductor device according to the first practical example.

Next, the crystal defect forming step is performed. In the crystal defect forming step, as shown in FIG. 5, charged particles are irradiated from a lower surface side of the mask 701 in a direction perpendicular to a lower surface of the wafer 610 to form a crystal defect in the diode forming region 620 of the wafer 610. The charged particles are irradiated by adjusting irradiating energy such that the charged particles stop at an upper drift layer 28a of the diode drift layer 28. As a result, a region with a high crystal defect density is formed on the upper drift layer 28a and becomes the carrier lifetime control region 39. A position of the end 39a of the carrier lifetime control region 39 is approximately consistent with the end 701a of the diode forming region 620 side of the mask 701.

Next, the ion doping step is performed. In the ion doping step, n-type impurity ions are doped twice to the lower surface of the wafer 610 to form an ion doping region doped with n-type ions in a part of a collector layer 652 on the lower surface of the wafer 610.

Figure 6:
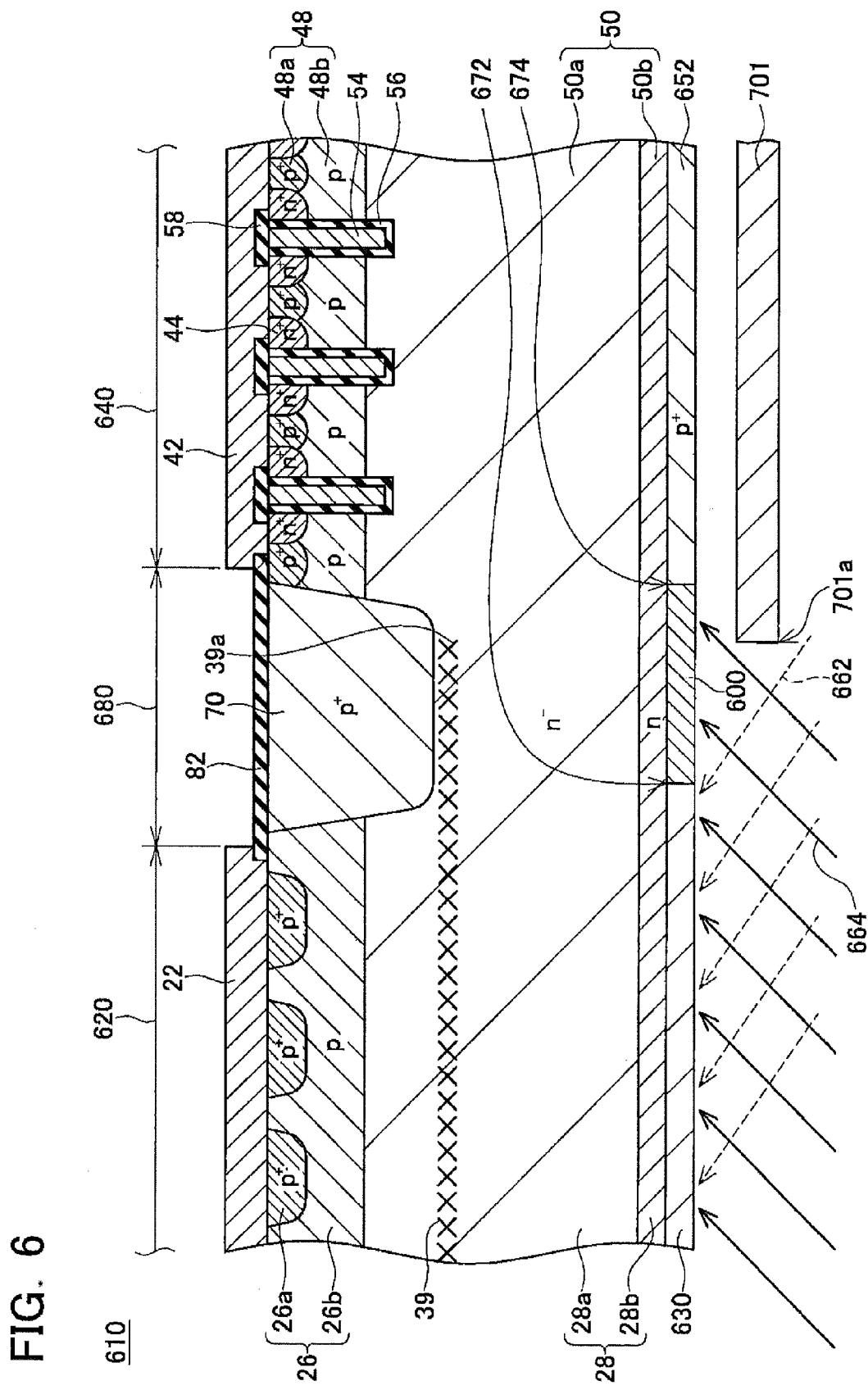
FIG. 6 is diagram illustrating the method for manufacturing the semiconductor device according to the first practical example.

As shown in FIG. 6, directions of the ion doping performed twice comprise: the direction from the side of the IGBT forming region 640 (a side of the region on which the mask has been formed in the masking step) to the side of the diode forming region 620 (the side of the region on which the mask was not formed in the masking step), the direction making an acute angle with the lower surface of the semiconductor wafer (hereinafter referred to as the first direction that is the direction denoted by a dashed arrow 662 in FIG. 6); and the direction from the side of the diode forming region 620 to the side of the IGBT forming region 640, the direction making an acute angle with the lower surface of the semiconductor wafer (hereinafter referred to as the second direction that is the direction denoted by a solid arrow 664 in FIG. 6). In the cross section shown in FIG. 6, the second direction intersects the first direction. As shown in FIG. 6, when doping of n-type ions is performed in the second direction, n-type ions are doped into a part 600 of the collector layer 652. On the other hand, when doping of n-type ions is performed in the first direction, n-type ions are not doped into the part 600. In FIG. 6, n-type ions are doped into a part 630 of the collector layer 652 which is on a side that is closer to the side of the diode forming region 620 than the part 600 when n-type ions are doped in any of the first direction and the second direction.

In other words, by performing the ion doping at least twice including in the first direction from the side of the IGBT forming region 640 to the side of the diode forming region 620, the first direction making the acute angle with the lower surface of the semiconductor wafer, and in the second direction intersecting with the first direction (more specifically, the second direction from the side of the diode forming region 620 to the side of the IGBT forming region 640, the second direction making an acute angle with the lower surface of the semiconductor wafer), two parts (the part 600 and the part 630) with different n-type ion densities can be formed on the lower surface of the diode forming region 620 of the wafer 610. The density of the n-type ions doped to the part 600 is lower than the density of the n-type ions doped to the part 630. The part 600 is a low ion doping region formed along the end 701a of the mask 701 on the side of the diode forming region 620 between the diode forming region 620 and the IGBT forming region 640.

An end of the part 600 on the side of the diode forming region 620 is assumed to be a boundary 672 and an end of the part 600 on the side of the IGBT forming region 640 is assumed to be a boundary 674. By adjusting a position of the mask 701 and ion doping angles in the first and second directions, a width of the part 600 (in other words, a length between the boundary 672 and the boundary 674) can be adjusted.

Figure 7:
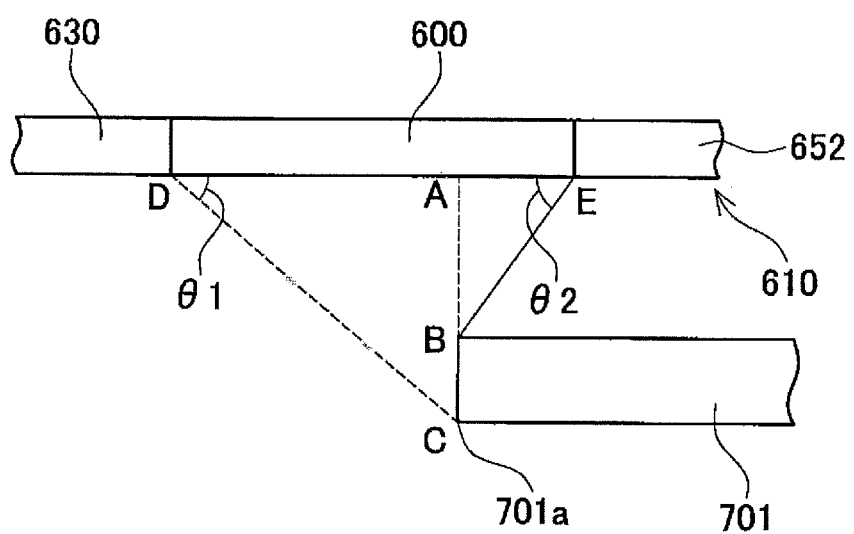
FIG. 7 is diagram illustrating the method for manufacturing the semiconductor device according to the first practical example.

In the first example, since a position of the mask 701 is fixed based on a position at which a crystal defect is formed, the width of the part 600 is adjusted by adjusting the ion doping angles of the first and second directions. An example of a method for designing ion doping angles of the first and second directions will now be described with reference to FIG. 7. FIG. 7 is a diagram which schematically shows the wafer 610 and a part of the mask 701 shown in FIG. 6 and which shows the end 701a of the mask 701 and the collector layer 652 positioned in a vicinity of the end 701a (including the part 600 and the part 630). Positions of points A, B, and C in FIG. 7 in a plan view of the wafer 610 are consistent with the end 701a of the mask 701. A line AB denotes a distance between the lower surface of the wafer 610 and a surface of the mask 701 on a side of the wafer 610 and is assumed to be d1. A line BC denotes a thickness of the mask 701 and is assumed to be d2. A line CD schematically shows a course of charged particles when ion doping is regulated by the end 701a and performed in the first direction, and a point D is approximately a same position as the boundary 672. If $\theta 1$ ($0<\theta 1<90°$) denotes an angle formed between the line CD and the lower surface of the wafer 610, then an angle formed between a course of charged particles during ion doping in the first direction and the lower surface of the wafer 610 is equivalent to $\theta 1$. A line BE schematically shows a course of charged particles when ion doping is regulated by the end 701a and performed in the second direction, and a point E is approximately a same position as the boundary 674. If $\theta 2$ ($0<\theta 2<90°$) denotes an angle formed between the line BE and the lower surface of the wafer 610, then an angle formed between a course of charged particles during ion doping in the second direction and the lower surface of the wafer 610 is equivalent to $\theta 2$.

A length of the line AD may be expressed as $(d1+d2)/\tan \theta 1$ and denotes a distance in a planar direction of the wafer 610 from the end 701a to the boundary 672. A length of the line AE may be expressed as $d1/\tan \theta 2$ and denotes a distance in the planar direction of the wafer 610 from the end 701a to the boundary 674. Consequently, a distance DE between the boundary 672 and the boundary 674 can be expressed by the formula (1) below.

$$(d1+d2)/\tan \theta 1 + d1/\tan \theta 2 \qquad (1)$$

In the first example, a value of $\theta 2$ is adjusted using the above formula (1) so that the low impurity layer 100 does not penetrate to a lower side of the body layer 48 of the IGBT region 40.

Figure 8:
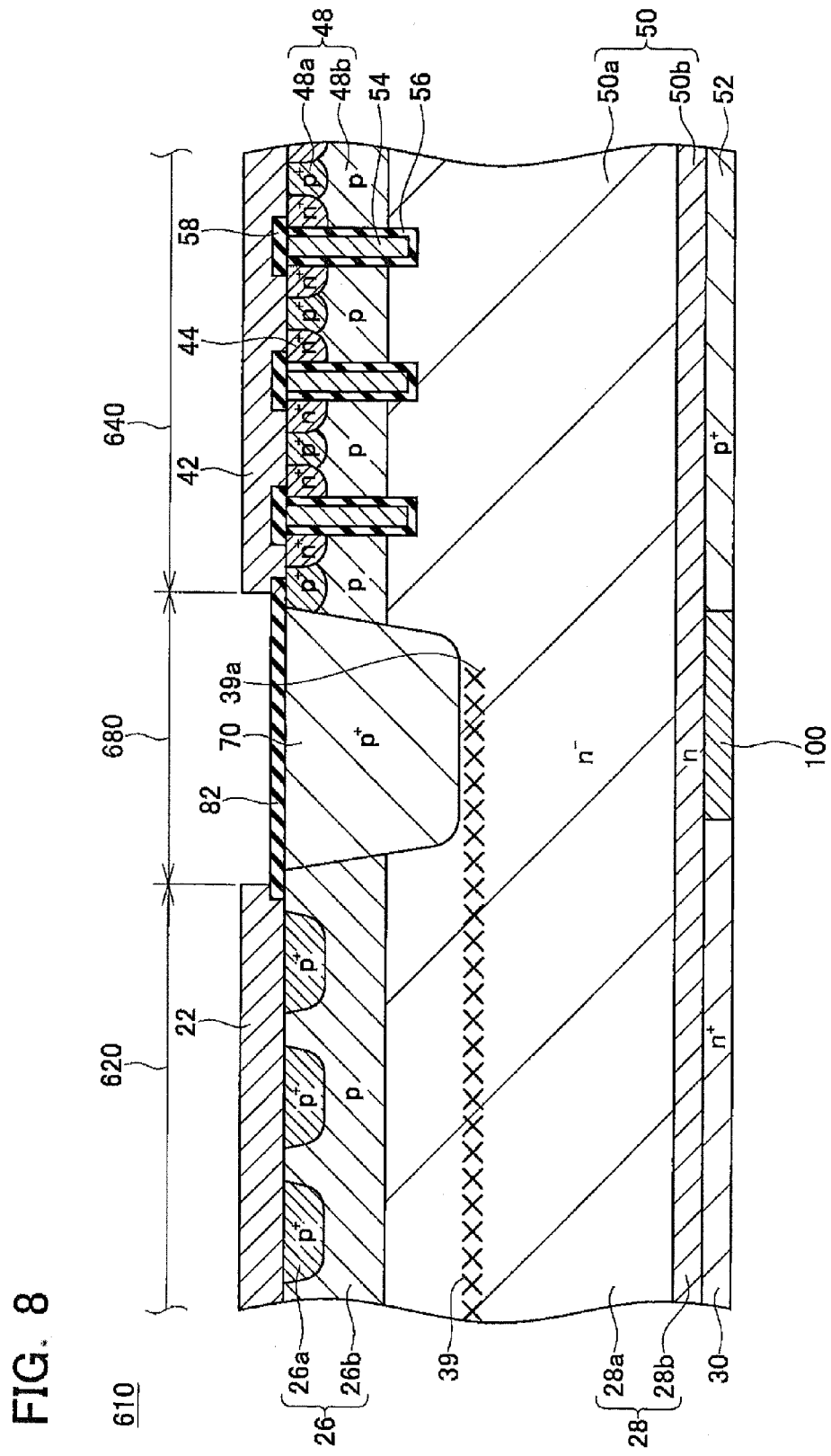
FIG. 8 is diagram illustrating the method for manufacturing the semiconductor device according to the first practical example.

Next, the mask 701 is removed and then the annealing step of the wafer 610 is performed. In the annealing step, the annealing of the part 600 and the part 630 which are the ion doping region is performed. When the annealing is performed, the part 630 becomes an n-type cathode layer 30 and the part 600 becomes the low impurity layer 100 having a lower density of n-type impurities than the cathode layer 30. Accordingly, as shown in FIG. 8, the lower surface of the wafer 610 can comprise three layers, namely, the collector layer 52, the low impurity layer 100, and the cathode layer 30. By forming the common electrode 60 shown in FIG. 1 on the lower surface of the wafer 610 shown in FIG. 8 and performing dicing to separate the wafer 610 into individual semiconductor devices, the semiconductor device 10 according to the present embodiment can be formed.

As described above, with the first manufacturing method, a mask is disposed on a lower surface side of any of the diode forming region and the IGBT forming region of the semiconductor wafer in the masking step. The subsequently-performed ion doping step comprises: performing ion doping in a direction from the side of the IGBT forming region to the side of the diode forming region, the direction making an acute angle with the lower surface of the semiconductor wafer (the first direction); and performing ion doping in a direction from the side of the diode forming region to the side of the IGBT forming region, the direction making an acute angle with the lower surface of the semiconductor wafer (the second direction). As a result, the low ion doping region in which one of the doping of ions in the first direction and the doping of ions in the second direction is blocked and to which the ions do not reach is created between the diode forming region and the IGBT forming region. By performing the annealing after forming the low ion doping region, a region with a low impurity density can be formed between the diode region and the IGBT region.

In the first manufacturing method, the mask for blocking first conductivity type impurity ions in the ion doping step can be used as a mask for blocking charged particles in the crystal defect forming step. Since a single mask can be used for both the ion doping step and the crystal defect forming step, the manufacturing step can be simplified.

In addition, as in the first example, by first aligning the position of the end of the mask disposed in the masking step with the position of the end of the carrier lifetime control region and then using the mask to perform ion doping in the first and second directions in the ion doping step, the boundary between the low impurity layer and the cathode layer can be positioned on the side closer to the diode region than the end of the carrier lifetime control region, and the boundary between the low impurity layer and the collector layer can be positioned on the side closer to the end of the carrier lifetime control region than the IGBT region. In other words, the end of the carrier lifetime control region can be positioned above the low impurity layer. Since the position of the end of the carrier lifetime control region and the position of the low impurity layer can be appropriately aligned simply using the single mask, the manufacturing step can be simplified. Furthermore, when a plurality of masks is used, a misalignment of positions of the plurality of masks may sometimes cause the position of the end of the carrier lifetime control region and the position of the low impurity layer to become misaligned. However, since the single mask is used, positions of a plurality of masks need not be aligned with each other.

Figure 9:
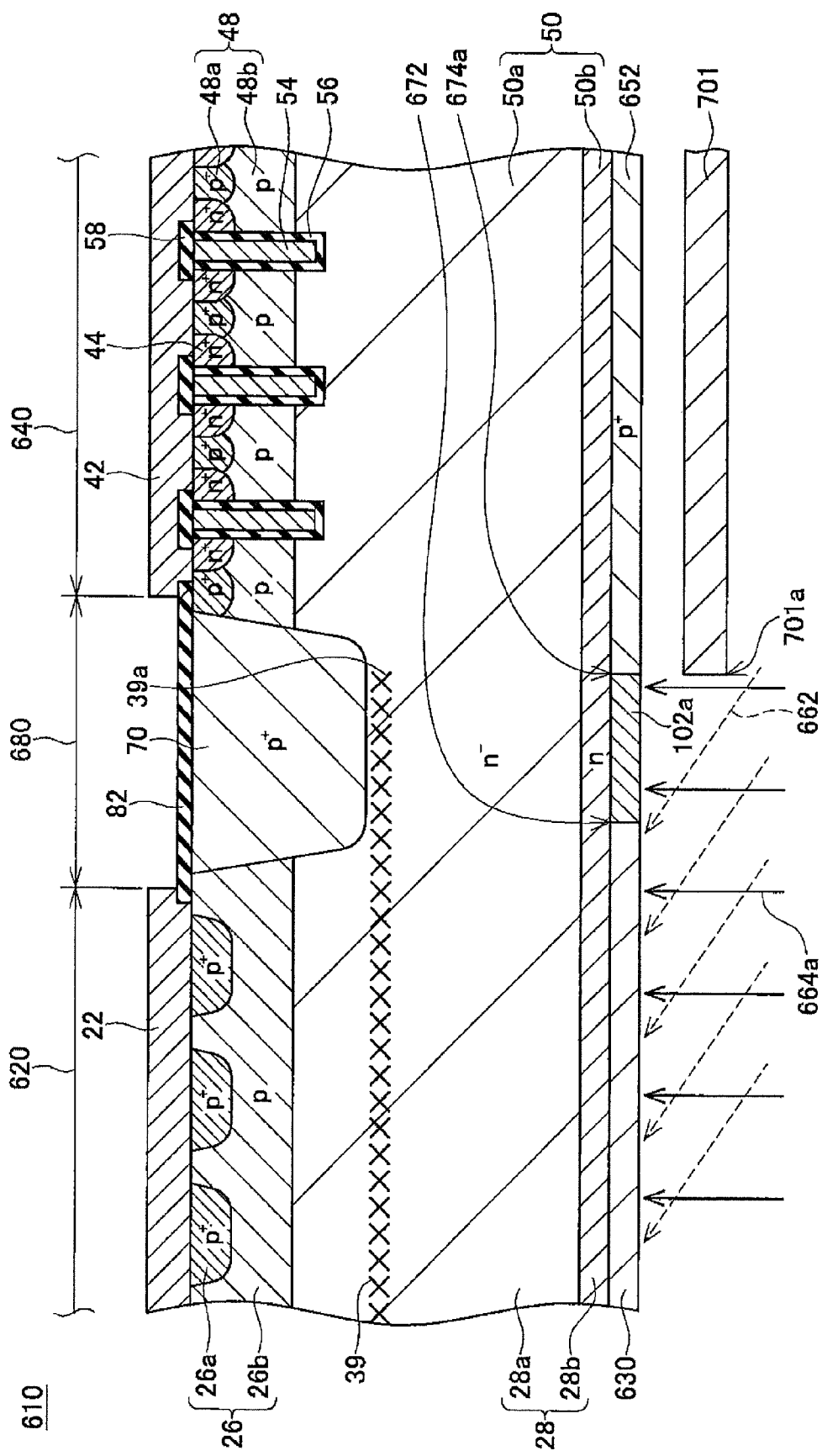
FIG. 9 is diagram illustrating a method for manufacturing a semiconductor device according to a modification.
Figure 10:
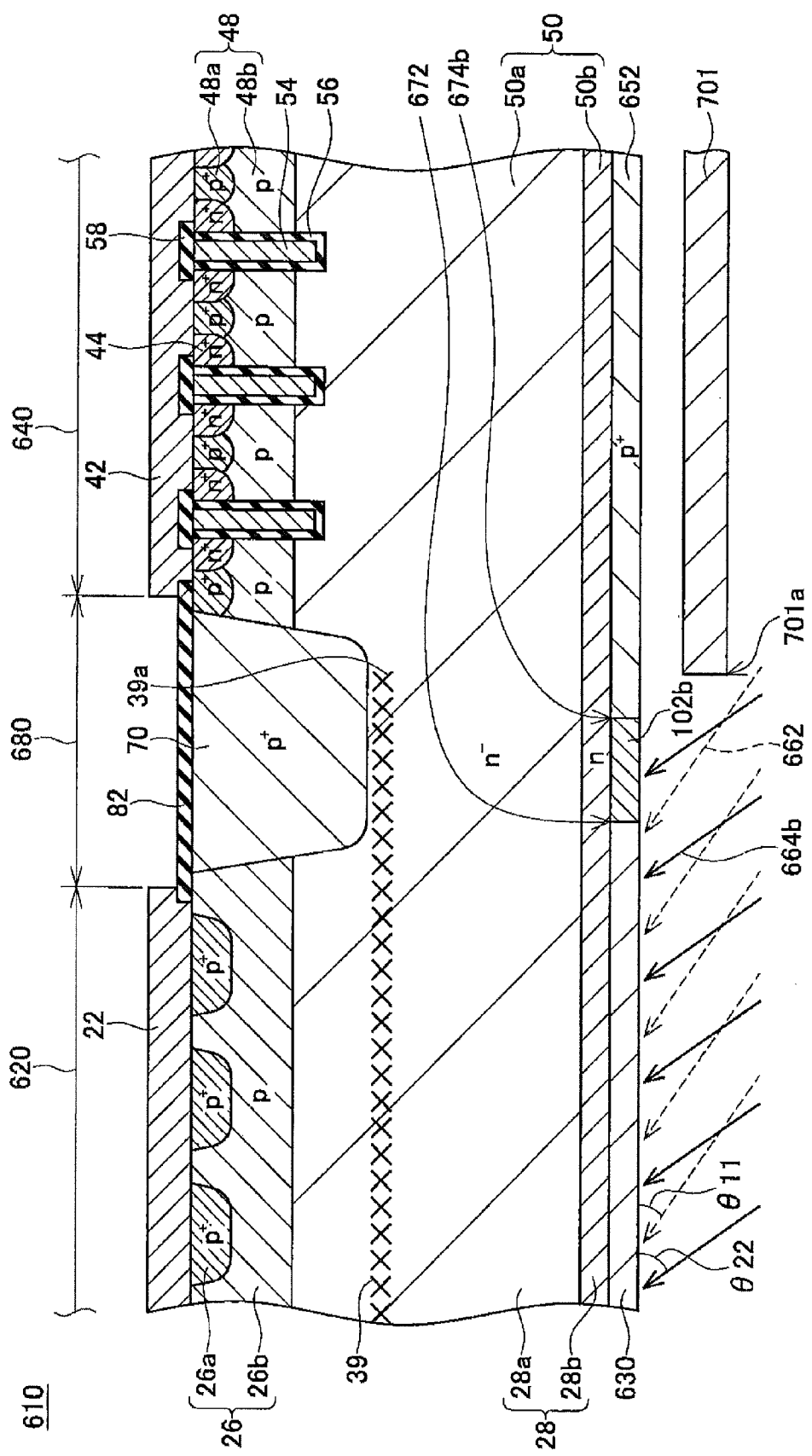
FIG. 10 is diagram illustrating the method for manufacturing the semiconductor device according to the modification.

Moreover, in FIG. 6, while the second direction is the direction from the side of the diode forming region in which the mask is not formed in the masking step to the side of the IGBT forming region in which the mask is formed in the masking step, such an arrangement is not restrictive. The second direction need only be a direction which intersects the first direction (i.e., a direction not parallel with the first direction) and which enables a portion in which one of doping of ions in the first direction and doping of ions in the second direction is blocked and to which the ions do not reach (a portion to become the low ion doping region) to be formed between the diode forming region and the IGBT forming region. For example, as shown in FIG. 9, when the first direction is a direction which is oriented from the IGBT forming region to the diode forming region and which makes an acute angle with the lower surface of the semiconductor wafer, the second direction may be a direction which intersects the first direction and which is perpendicular to the lower surface of the semiconductor wafer. In this case, since ion doping in the second direction is not performed on a side closer to the IGBT forming region 640 than the end 701*a*, a boundary 674*a* between a low impurity layer 102*a* and the IGBT forming region 640 is consistent with the end 701*a* of the mask 701 on the side of the diode forming region 620. In addition, as shown in FIG. 10, when the first direction is a direction which is oriented from the IGBT forming region to the diode forming region and which makes an acute angle $\theta 11$ with the lower surface of the semiconductor wafer, the second direction may be a direction oriented from the IGBT forming region to the diode forming region, the second direction making an acute angle $\theta 21$ with the lower surface of the semiconductor wafer, where $\theta 21 > \theta 11$. In this case, similarly, the second direction intersects with the first direction and enables a low ion doping region to be formed on the lower surface of the semiconductor wafer. A boundary 674*b* between a low impurity layer 102*b* and the IGBT forming region 640 becomes closer to a side of the IGBT forming region 640 than the end 701*a* of the mask 701 on the side of the diode forming region 620.

Figure 11:
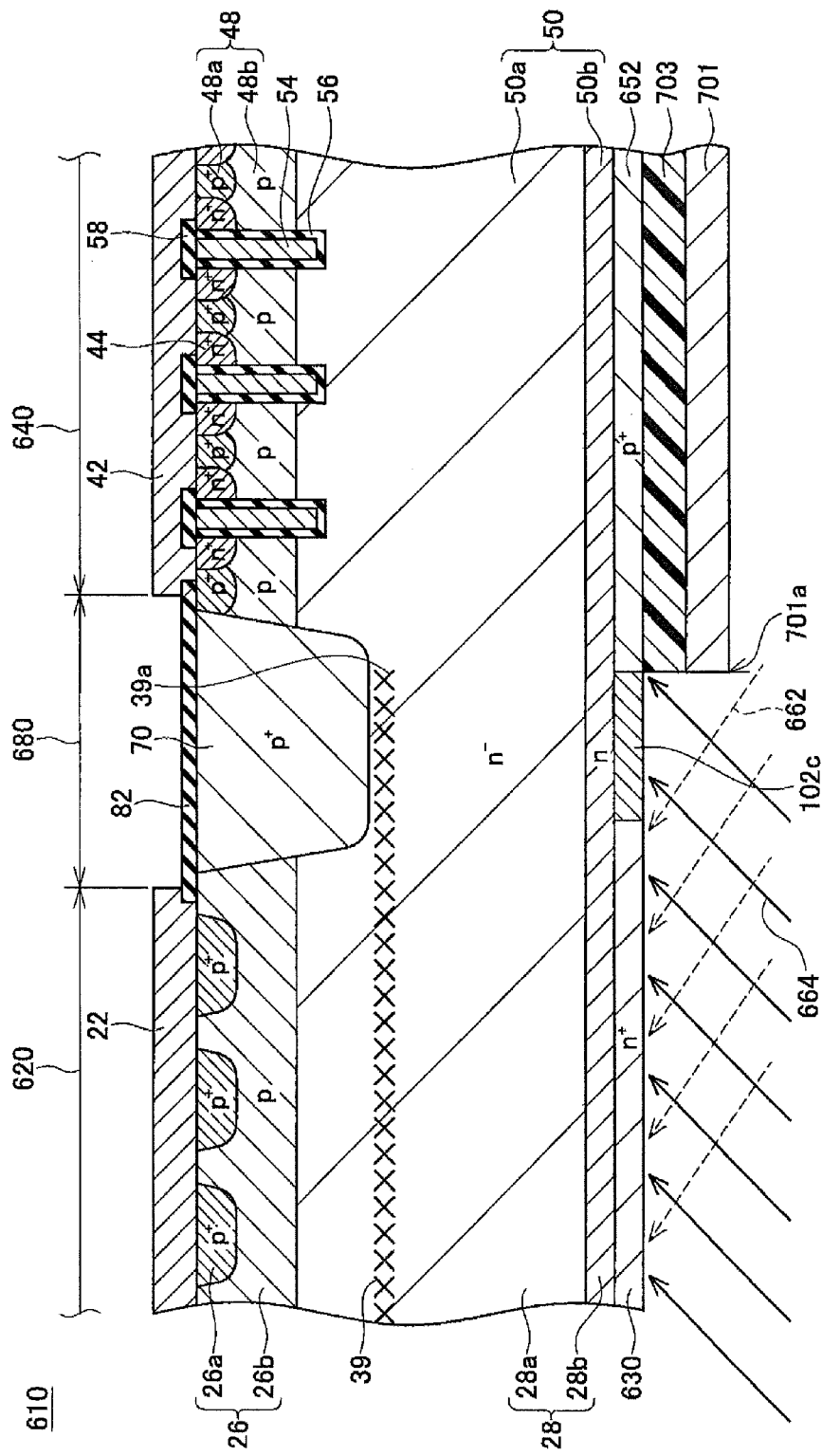
FIG. 11 is diagram illustrating the method for manufacturing the semiconductor device according to the modification.

Furthermore, as shown in FIG. 11, the mask 701 may be attached to the lower surface of the wafer 610 using a resist 703. In this case, since ion doping is not performed on a side closer to the IGBT forming region 640 than the end 701*a*, a boundary 674*c* between a low impurity layer 102*c* and the IGBT forming region 640 is consistent with the end 701*a* of the mask 701 on the side of the diode forming region 620.

(Second Manufacturing Method)

A second method for manufacturing the semiconductor device 10 comprises a masking step of disposing a mask on a lower surface side of an IGBT forming region of a semiconductor wafer, a crystal defect forming step of irradiating charged particles from a lower surface side of the mask to a lower surface of the semiconductor wafer and forming a crystal defect in the diode forming region of the semiconductor wafer, an ion doping step of doping impurity ions from the lower surface side of the mask to the lower surface of the semiconductor wafer and forming an ion doping region, and a laser annealing step of performing laser annealing of the ion doping region with the mask being disposed.

Figure 12:
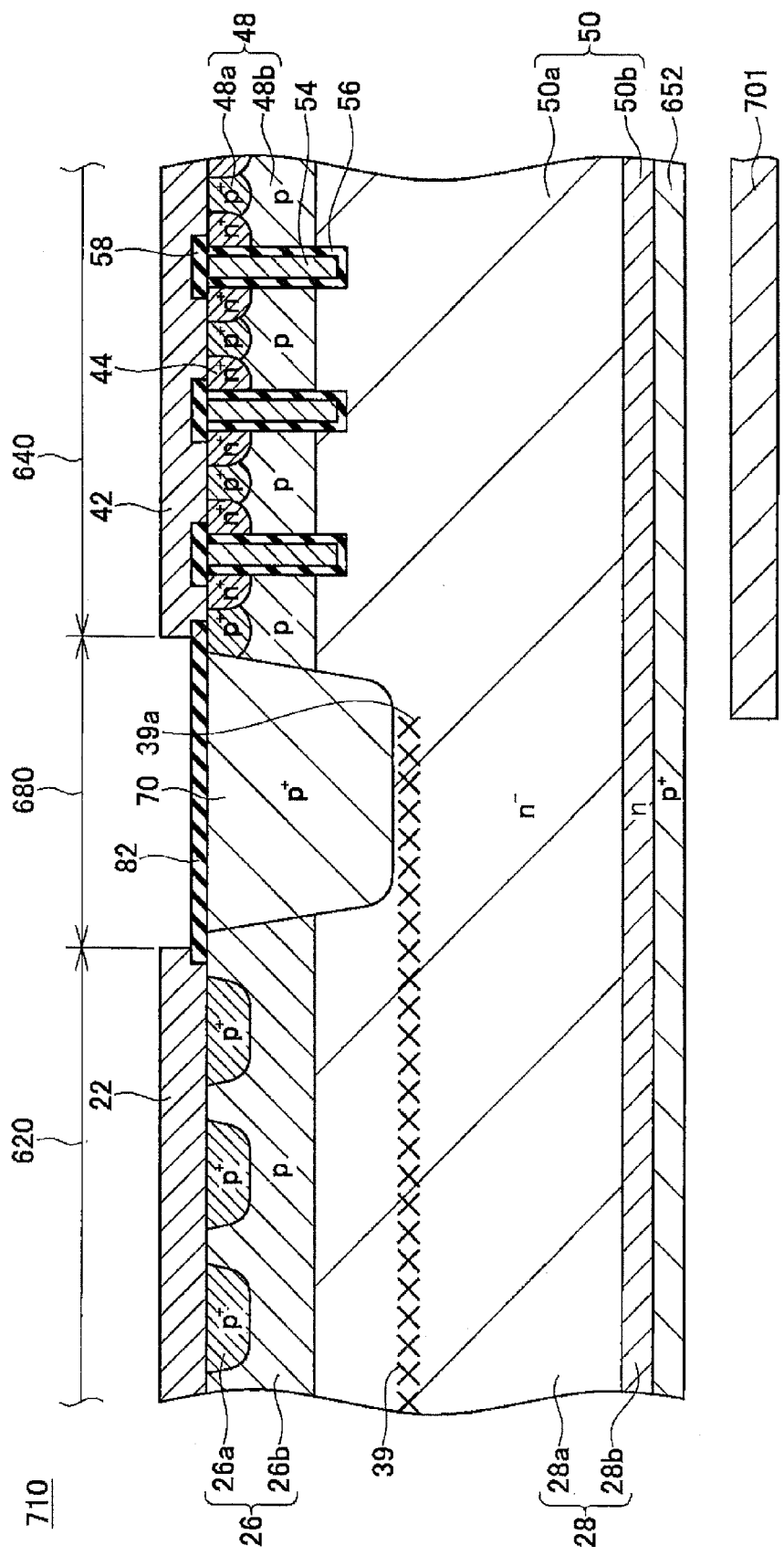
FIG. 12 is diagram illustrating a method for manufacturing a semiconductor device according to a second practical example.

Hereinafter, the second manufacturing method will now be described more specifically as a second example with reference to FIGS. 12 to 14 which illustrate the method for manufacturing the semiconductor device 10 according to the present embodiment.

SECOND EXAMPLE

Since the masking step and the crystal defect forming step according to the second example are similar to those according to the first example of the first manufacturing method, a description thereof will be omitted. FIG. 12 shows a wafer 710 after steps up to the crystal defect forming step have been completed on the wafer 610 shown in FIG. 2. A carrier lifetime control region 39 is formed in an upper drift layer 28*a* of a diode drift layer 28 of the wafer 710. A mask 701 is disposed on a lower surface side of the wafer 710 in a same manner as in FIG. 4. In FIG. 12, components similar to those shown in FIGS. 1 and 2 are denoted by the same reference numerals.

Next, an ion doping step is performed. In the ion doping step, n-type impurity ions are doped to the lower surface of the wafer 710 and, as shown in FIG. 13, an ion doping region 730 doped with n-type ions is formed in a part of a collector layer 652 on the lower surface of the wafer 710.

Next, a laser annealing step is performed with a mask 701 being disposed. In the laser annealing step, annealing of the ion doping region is performed by laser annealing. While laser light irradiated on the ion doping region 730 causes ions to be sufficiently activated in a portion that enters a high energy state, energy sufficient for ion activation cannot be obtained in a vicinity of a boundary with a region in which a mask is disposed. When a laser is irradiated on a vicinity of an end 701*a* of the mask 701 as shown in FIG. 14, while a part 120 enters a high energy state and ions are sufficiently activated, a part 123 closer to a side of an IGBT forming region 640 than the part 120 enters a state of insufficient energy and ions are not sufficiently activated. Ion activation in the part 123 becomes insufficient and the part 123 becomes a low impurity layer 103 with a low impurity density. By scanning an entire ion doping region 730 on a lower surface of the diode forming region 620 by laser light, ions are sufficiently activated in regions other than a vicinity of a boundary with a region in which a mask is disposed and, as shown in FIG. 14, the cathode layer 30 can be formed on an entire lower surface of the diode forming region 620. At the same time, the low impurity layer 103 can be formed between the cathode layer 30 and the collector layer 52 along the end 701*a* of the mask 701. By forming the common electrode 60 shown in FIG. 1 on the lower surface of the wafer 710 shown in FIG. 14 and performing dicing to separate the wafer 710 into individual semiconductor devices, the semiconductor device 10 according to the present embodiment can be formed.

As described above, even when using the second manufacturing method, the mask for blocking first conductivity type impurity ions in the ion doping step can be used as a mask for blocking charged particles in the crystal defect forming step in a same manner as using the first manufacturing method. Since a position of an end of the carrier lifetime control region and a position of the low impurity layer can be appropriately aligned using a single mask, a manufacturing step can be simplified. In addition, since a single mask is used, positions of a plurality of masks need not be aligned with each other.

(Third Manufacturing Method)

A third method for manufacturing the semiconductor device 10 described above comprises a masking step of disposing a mask on a lower surface side of an IGBT forming region of a semiconductor wafer, a crystal defect forming step of irradiating charged particles from a lower surface side of the mask to a lower surface of the semiconductor wafer and forming a crystal defect in the diode forming region of the semiconductor wafer, an ion doping step of doping impurity ions from the lower surface side of the mask to the lower surface of the semiconductor wafer and forming a first conductivity type collector region and a second conductivity type cathode region, which are adjacent to each other, and a laser annealing step of performing laser annealing of a boundary between the collector region and the cathode region in the lower surface of the semiconductor wafer.

Hereinafter, the third manufacturing method will now be described more specifically as a third example with reference to FIGS. 15 to 17 which illustrate the method for manufacturing the semiconductor device according to the present embodiment.

THIRD EXAMPLE

Figure 13:
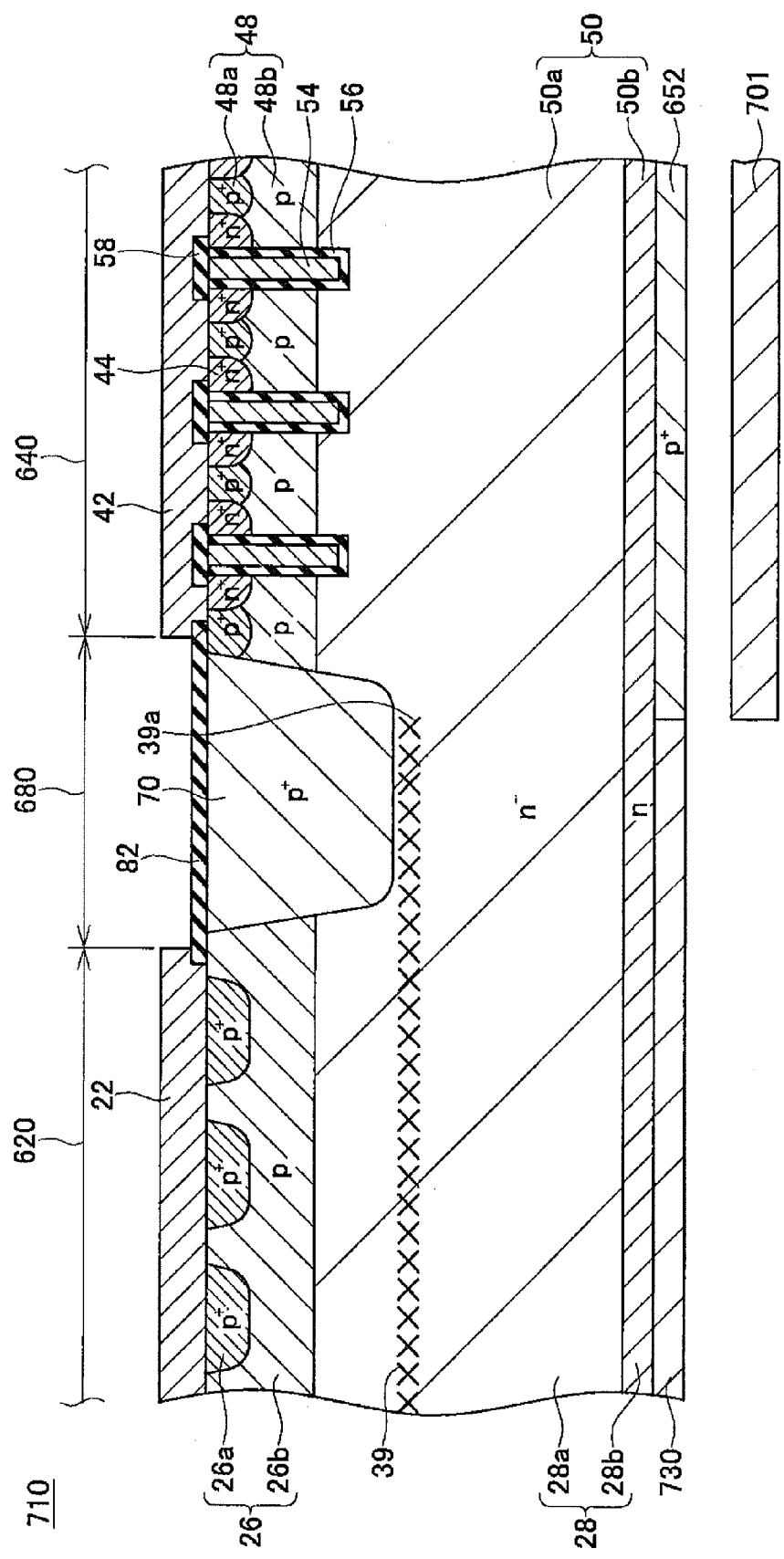
FIG. 13 is diagram illustrating the method for manufacturing the semiconductor device according to the second practical example.
Figure 14:
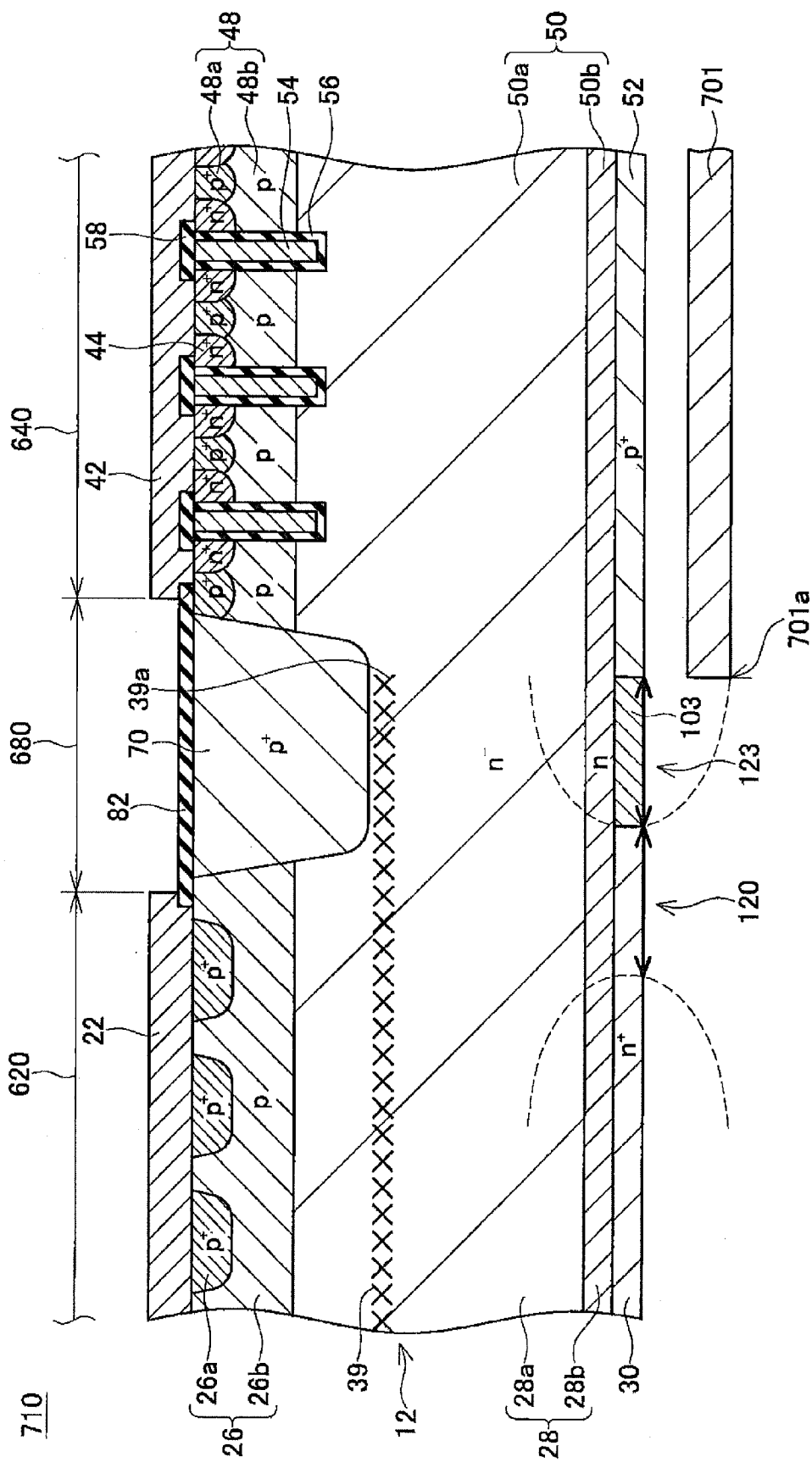
FIG. 14 is diagram illustrating the method for manufacturing the semiconductor device according to the second practical example.

In the third example, after manufacturing a wafer 710 shown in FIG. 13 by a manufacturing step similar to that of the second example according to the second manufacturing method, a mask 701 is removed and annealing is performed. Consequently, a wafer 810 shown in FIG. 15 can be manufactured. In FIG. 15, components similar to those shown in FIGS. 1, 2, and 13 are denoted by the same reference numerals.

Figure 15:
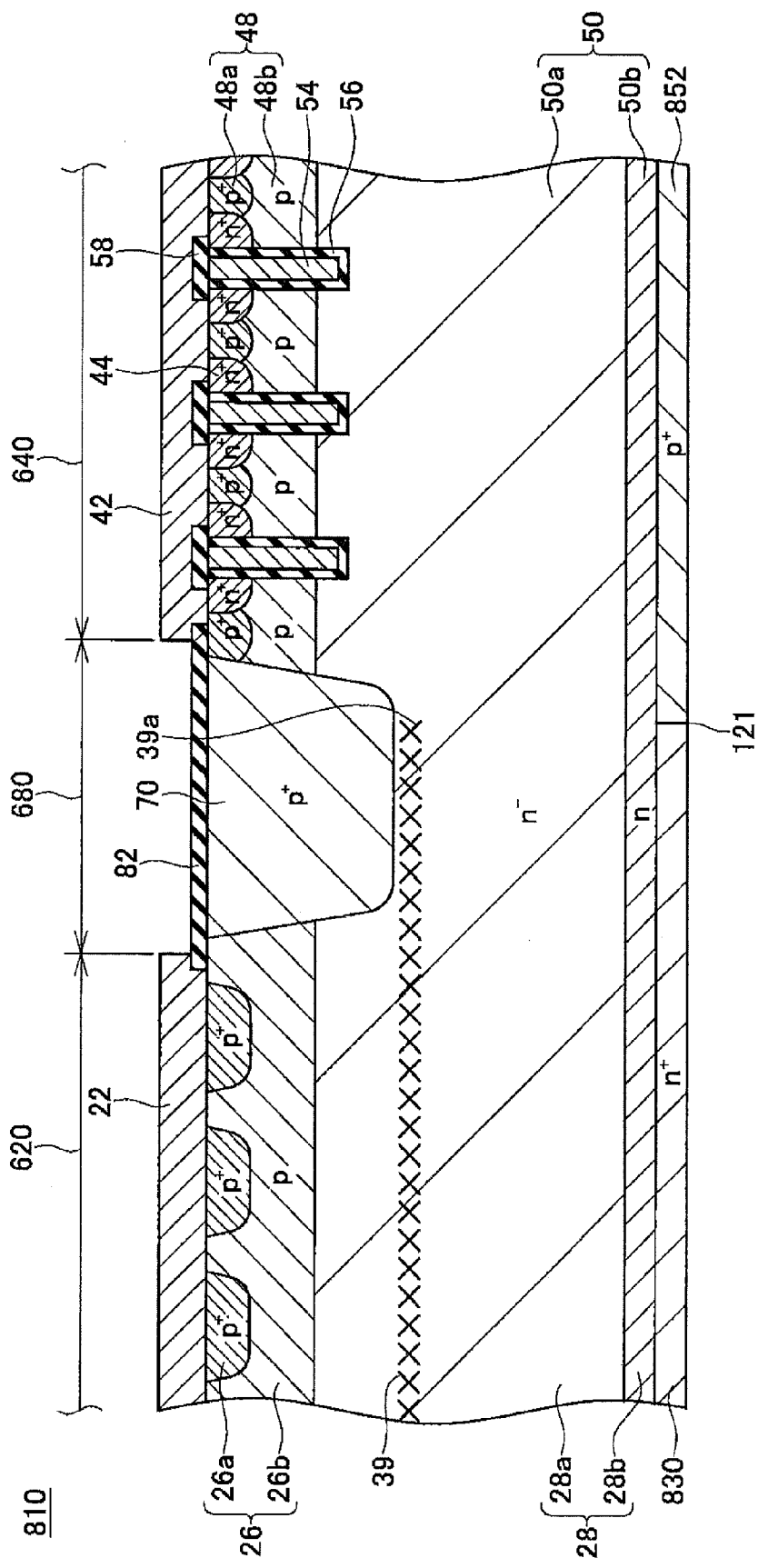
FIG. 15 is diagram illustrating a method for manufacturing a semiconductor device according to a third practical example.
Figure 16:
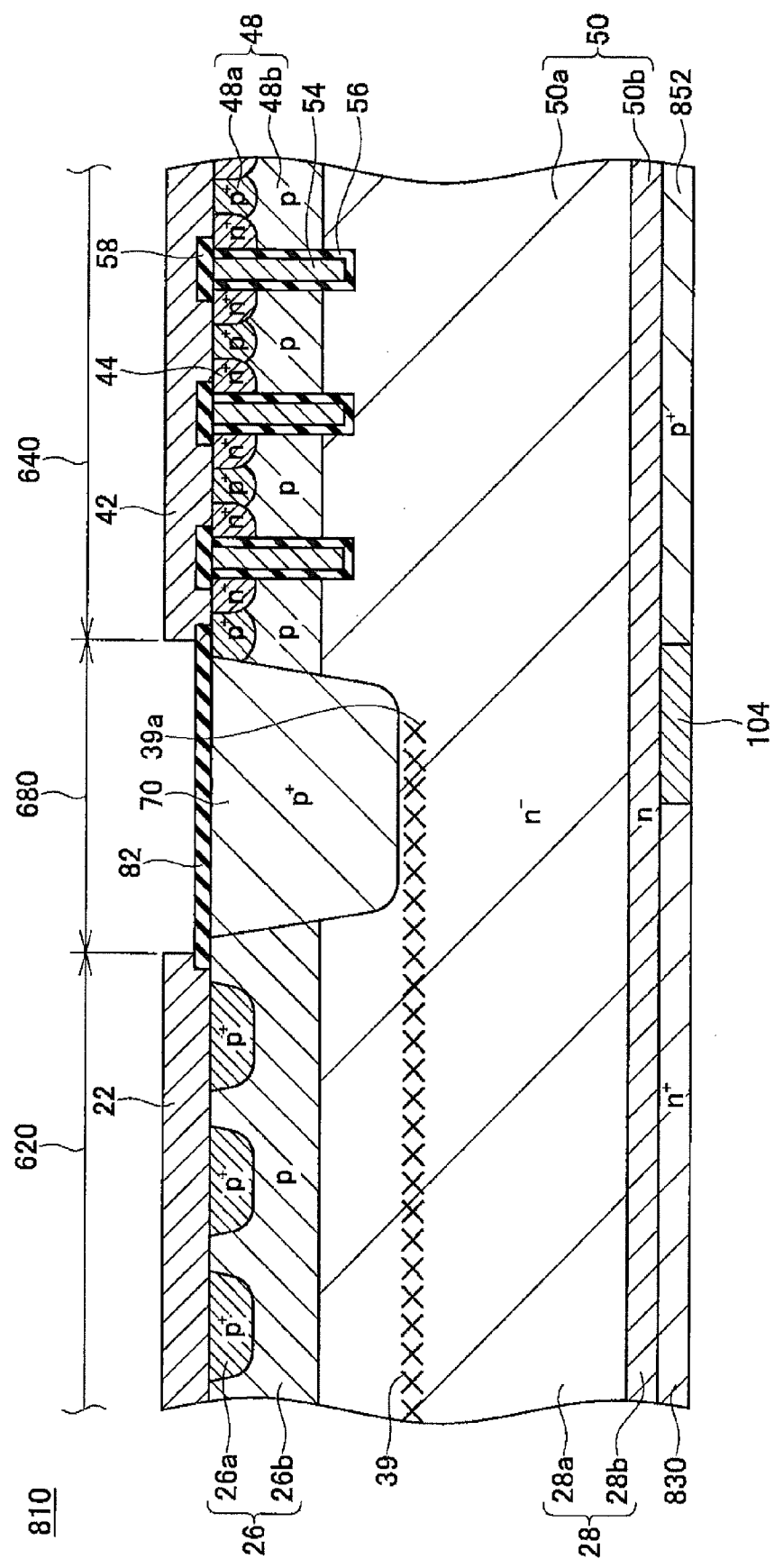
FIG. 16 is diagram illustrating the method for manufacturing the semiconductor device according to the third practical example.

As shown in FIG. 15, an n-type cathode layer 830 and a p-type collector layer 852 are formed adjacent with each other on a lower surface side of the wafer 810. A boundary 121 is a boundary between the cathode layer 830 and the collector layer 852.

Laser annealing is performed on the boundary 121 on the lower surface side of the wafer 810 shown in FIG. 15. When laser annealing is performed by irradiating laser light on the boundary 121, the cathode layer 830 and the collector layer 852 in a vicinity of the boundary 121 are locally heated. As a result, n-type impurities in the cathode layer 830 and p-type impurities in the collector layer 852 cancel each other out and, as shown in FIG. 16, a low impurity layer 104 with a low impurity density is formed. To make the low impurity layer 104 an n-type impurity layer, for example, an n-type impurity density of the cathode layer 830 need only be set higher than a p-type impurity density of the collector layer 852.

Figure 17:
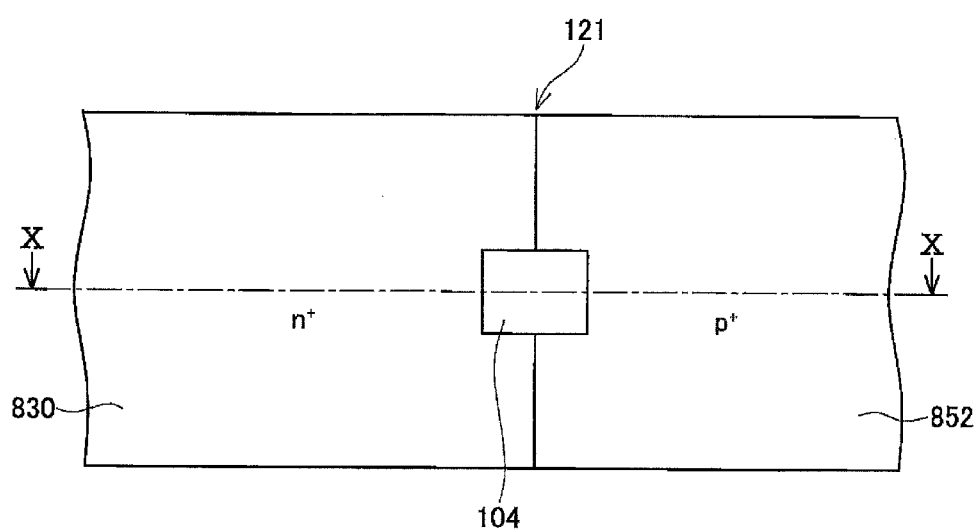
FIG. 17 is diagram illustrating the method for manufacturing the semiconductor device according to the third practical example.

FIG. 17 is a diagram of the wafer 810 as viewed from a lower surface side of the wafer 810. According to the third manufacturing method, as shown in FIG. 17, the low impurity layer 104 can be selectively formed at a part between the cathode layer 830 and the collector layer 852. By first performing laser annealing on the entire boundary 121 and forming the low impurity layer 104 between the cathode layer 830 and the collector layer 852, forming the common electrode 60 shown in FIG. 1 on the lower surface of the wafer 810, and then performing dicing to separate the wafer 810 into individual semiconductor devices, the semiconductor device 10 according to the present embodiment can be formed.

As described above, even when using the third manufacturing method, the mask for blocking first conductivity type impurity ions in the ion doping step can be used as a mask for blocking charged particles in the crystal defect forming step in a same manner as using the first and second manufacturing methods. Since a position of an end of the carrier lifetime control region and a position of the low impurity layer can be appropriately aligned using a single mask, a manufacturing step can be simplified. In addition, since a single mask is used, positions of a plurality of masks need not be aligned with each other.

Furthermore, according to a third manufacturing method, as shown in FIG. 17, a semiconductor device can be manufactured in which the low impurity layer is selectively formed at a part between the cathode layer and the collector layer.

Moreover, in the first to third manufacturing methods, any of the ion doping step and the crystal defect forming step may be performed first.

Furthermore, it will be obvious to those skilled in the art that the semiconductor device 10 can be manufactured by method other than the first, second, and third manufacturing methods described above. For example, the lower surface of the wafer 610 shown in FIG. 3 can be subjected to: doping by first n-type ions using a first mask patterned to conform to the cathode layer 30; doping by second n-type ions using a second mask patterned to conform to the low impurity layer 100 at a lower impurity density than the doping of the first n-type ions; doping by p-type ions using a third mask patterned to conform to the collector layer 52; and subsequent annealing.

Figure 18:
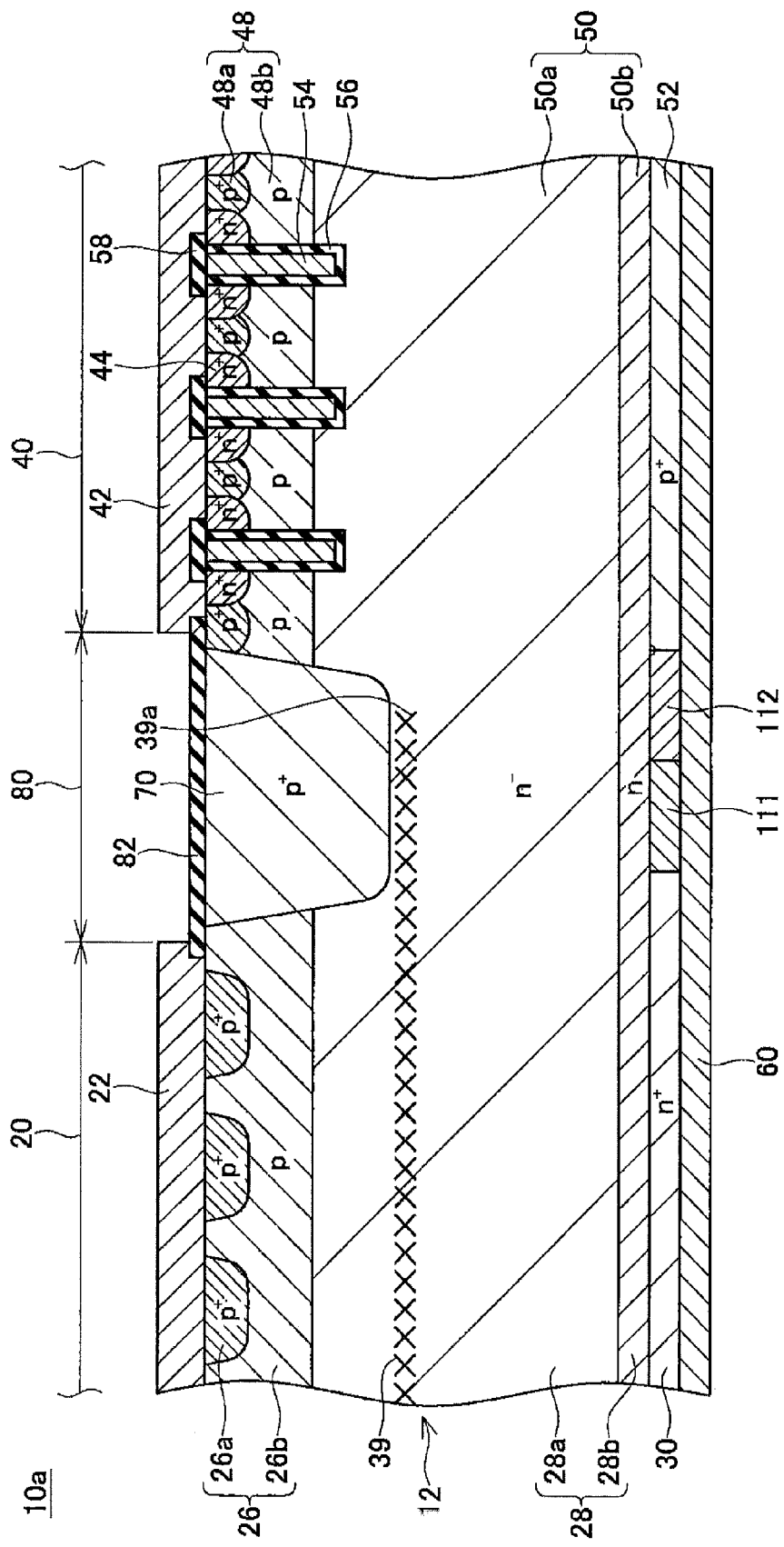
FIG. 18 is a cross-sectional view of a semiconductor device according to another embodiment.

While a semiconductor device with an n-type low impurity layer has been exemplified in the above description, a p-type low impurity layer may be used instead. In the semiconductor device 10 shown in FIG. 1, a p-type low impurity layer may be formed in place of the n-type low impurity layer 100. In this case, an impurity density of the p-type low impurity layer is lower than a density of p-type impurities of the collector layer 52. In addition, as is the case of a semiconductor device 10a shown in FIG. 18, both an n-type low impurity layer 111 and a p-type low impurity layer 112 can be provided. Furthermore, in FIG. 18, positions of the n-type low impurity layer 111 and the p-type low impurity layer 112 may be interchanged. Moreover, in FIG. 18, components similar to those shown in FIG. 1 are denoted by the same reference numerals.

In a same manner as an n-type low impurity layer, a p-type low impurity layer has a higher electrical resistance than both of a cathode layer and a collector layer. Therefore, even when a p-type low impurity layer is formed in place of the n-type low impurity layer 100 in the semiconductor device 10 shown in FIG. 1, an operational advantage similar to the case described above in which the n-type low impurity layer 100 is formed can be obtained. In other words, even when a p-type low impurity layer is formed, an effect of suppressing an increase in on-voltage during an IGBT operation and an effect of improving recovery characteristics of a diode can be obtained. Furthermore, when a contact resistance of the p-type low impurity region and the common electrode is higher than both of a contact resistance of the cathode region and the common electrode and a contact resistance of the collector region and the common electrode, an increase in on-voltage during an IGBT operation can be suppressed and recovery characteristics of a diode can be improved more effectively in a same manner as an n-type low impurity layer.

Even when the semiconductor device 10 shown in FIG. 1 is provided with a p-type low impurity layer in place of the n-type low impurity layer 100, the semiconductor device 10 can be manufactured using the first to third manufacturing methods described above.

Figure 19:
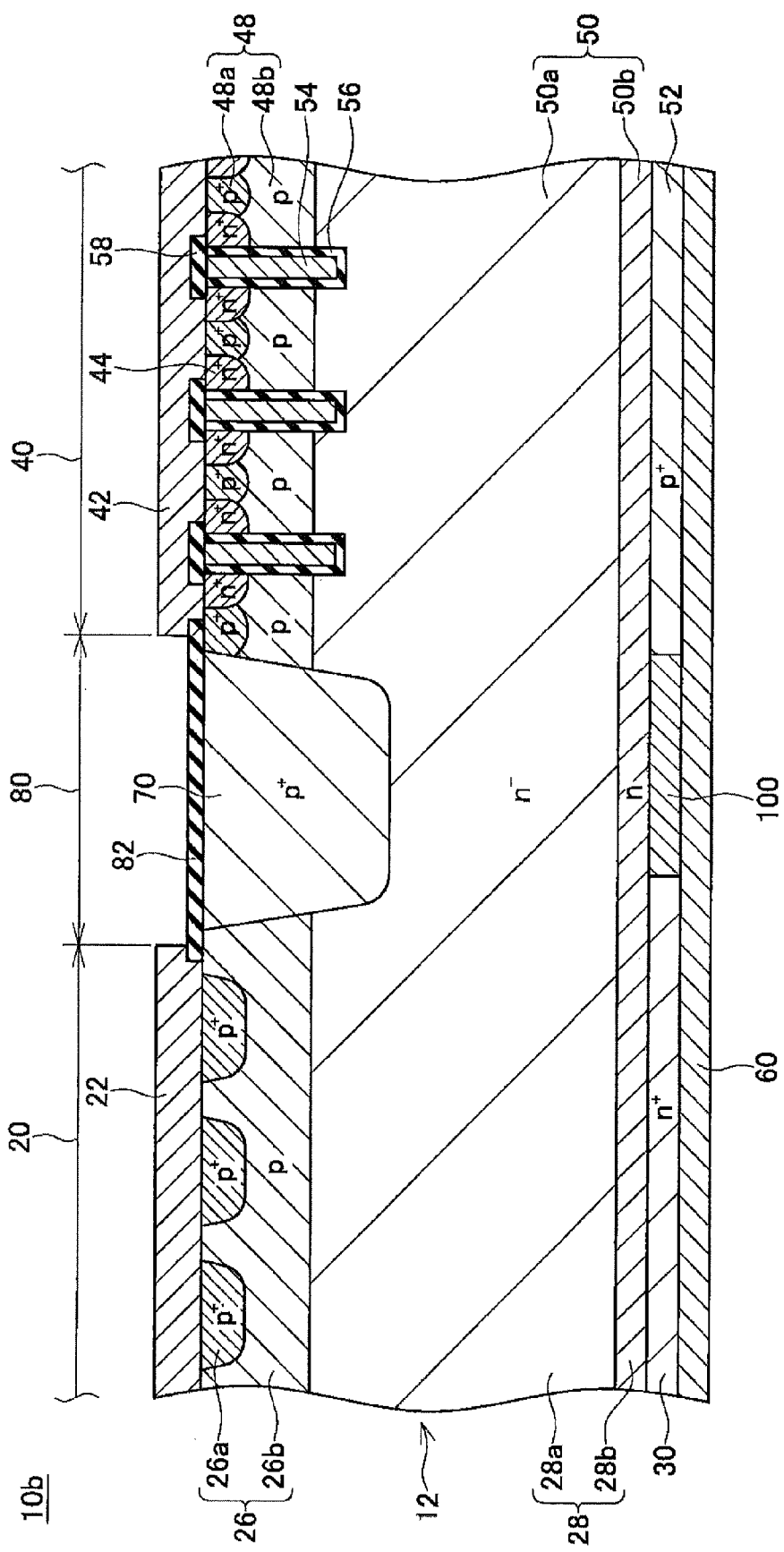
FIG. 19 is a cross-sectional view of a semiconductor device according to another embodiment.

While a semiconductor device in which a carrier lifetime control region 39 is provided in a diode region 20 has been exemplified in the above description, a semiconductor device 10b not provided with a carrier lifetime control region as shown in FIG. 19 can be used instead. The operational advantage obtained when the semiconductor device described above and comprising with a low impurity layer can also be obtained with a semiconductor device not comprising the carrier lifetime control region. Moreover, in FIG. 19, components similar to those shown in FIG. 1 are denoted by the same reference numerals. A semiconductor device not comprising a carrier lifetime control region can be manufactured using the first to third methods of manufacturing the semiconductor device 10 described above but by not performing the crystal defect forming step.

In addition, while the first conductivity is assumed to be the p-type and the second conductivity type is assumed to be the n-type in the description above, the first conductivity type may be assumed to be the n-type and the second conductivity type may be assumed to be the p-type.

Some of the features of the above embodiment will be described. In the above semiconductor device, an electrode in contact with a lower surface of the semiconductor substrate is preferably provided by exposing the cathode region, the collector region and the low impurity region at the lower surface of the semiconductor substrate. In this case, a contact resistance of the low impurity region and the electrode is preferably higher than both of a contact resistance of the cathode region and the electrode and a contact resistance of the collector region and the electrode. The carrier density between the diode region and the IGBT region can be further reduced.

Preferably, a boundary between the cathode region and the low impurity region is located on a diode region side from a position under the body region of the IGBT region in a plan view of the semiconductor device.

A lifetime control region may be formed in the diode drift region. A lifetime of a carrier in the lifetime control region is shorter than that in the diode drift region outside the lifetime control region. Preferably, an IGBT region side end of the lifetime control region is located above the low impurity region in a plan view of the semiconductor device.

A first conductivity type separation region may be formed in a range between the diode region and the IGBT region and extending from the upper surface of the semiconductor substrate to a position deeper than both of a lower end of an anode region and a lower end of a body region. In this case, an IGBT region side end of the lifetime control region may be located under the separation region in a plan view of the semiconductor device.

The present specification also provides a method for manufacturing the semiconductor device described above. A first method for manufacturing the semiconductor device described above comprises a masking step, an ion doping step, and an annealing step. In the masking step, a mask is disposed on one of a lower surface side of a diode forming region and a lower surface side of an IGBT forming region of a semiconductor wafer. In the ion doping step, impurity ions are doped from a lower surface side of the mask to a lower surface of the semiconductor wafer to form an ion doping region. The ion doping step comprises a first ion doping step of doping the impurity ions in a first direction from a region on which the mask has been formed in the masking step to a region on which the mask was not formed, the first direction making an acute angle with the lower surface of the semiconductor wafer, and a second ion doping step of doping the impurity ions in a second direction which intersects with the first direction. In the annealing step, annealing of the ion doping region is performed.

In the masking step, a mask is disposed on one of a diode forming region and an IGBT forming region. By performing the first ion doping step of doping the impurity ions in a first direction from a region on which the mask has been formed in the masking step to a region on which the mask was not formed, the first direction making an acute angle with the lower surface of the semiconductor wafer, and the second ion doping step of doping the impurity ions in a second direction which intersects with the first direction, a portion in which one of doping of ions in the first direction and doping of ions in the second direction is blocked and to which the ions do not reach is formed in a vicinity of a boundary between the diode forming region and the IGBT forming region. The portion is a low ion doping region formed in a vicinity of a boundary between the diode forming region and the IGBT forming region. By forming a low ion doping region, a region with a low impurity density can be formed between the diode region and the IGBT region.

A second method for manufacturing the semiconductor device described above comprises a masking step of disposing a mask on one of a lower surface side of a diode forming region and a lower surface side of an IGBT forming region of a semiconductor wafer, an ion doping step of doping impurity ions from a lower surface side of the mask to a lower surface of the semiconductor wafer and forming an ion doping region, and a laser annealing step of performing laser annealing of the ion doping region with the mask being disposed.

When performing annealing of the ion doping region by the laser annealing, ions are activated by irradiating the ion doping region with a laser. Since an ion doping region in a vicinity of a boundary of a region in which the mask is disposed does not become sufficiently hot, the ions are not sufficiently activated and the ion doping region becomes a low impurity region. Since the mask is disposed in one of the diode forming region and the IGBT forming region in the masking step, a region with a low impurity density can be formed between the diode forming region and the IGBT forming region.

In the masking step of the first and second manufacturing methods described above, the mask may be fixed with the semiconductor wafer via a bond layer which is in contact with the lower surface of the semiconductor wafer.

A third method for manufacturing the semiconductor device described above comprises a masking step of disposing a mask on one of an lower surface side of a diode forming region and an lower surface side of an IGBT forming region of a semiconductor wafer, an ion doping step of doping ions from a lower surface side of the mask to a lower surface of the semiconductor wafer and forming a first conductivity type collector region and a second conductivity type cathode region, which are adjacent to each other, and a laser annealing step of performing laser annealing of a boundary between the collector region and the cathode region on the lower surface of the semiconductor wafer.

Performing the laser annealing enables a region having a lower density of first conductivity type impurities than that in the first conductivity type collector region and a lower density of second conductivity type impurities than that in the second conductivity type cathode region can be formed in a vicinity of the boundary between the first conductivity type collector region and the second conductivity type cathode region.

The first to third manufacturing methods described above may further include a crystal defect forming step. In this case, preferably, the mask is disposed on the lower surface side of the IGBT forming region of the semiconductor wafer in the masking step and charged particles are irradiated from a lower surface side of the mask to a lower surface of the semiconductor wafer to form a crystal defect in the diode forming region of the semiconductor wafer in the crystal defect forming step. The mask disposed in the masking step may be used both as a mask for blocking impurity ions in the ion doping step and a mask for blocking charged particles in the crystal defect forming step.

While examples of the present embodiment have been described in detail, such examples are merely illustrative and are not intended to limit the scope of claims. Techniques described in the scope of claims include various modifications and changes of the specific examples illustrated above.

It is to be understood that the technical elements described in the present specification and the drawings exhibit technical usefulness solely or in various combinations thereof and shall not be limited to the combinations described in the claims at the time of filing. Furthermore, the techniques illustrated in the present specification and the drawings are to achieve a plurality of objectives at the same time, whereby technical usefulness is exhibited by attaining any one of such objectives.

What is claimed is:

1. A semiconductor device comprising a semiconductor substrate in which a diode region and an IGBT region are formed, wherein
the diode region comprises:
a first conductivity type anode region exposed at an upper surface of the semiconductor substrate,
a second conductivity type diode drift region formed on a lower surface side of the anode region, and
a second conductivity type cathode region, which has a higher density of second conductivity type impurities than in the diode drift region, formed on a lower surface side of the diode drift region,
the diode drift region comprises an upper drift layer and a lower drift layer which has a higher density of second conductivity type impurities than the upper drift layer,
the IGBT region comprises:
a second conductivity type emitter region exposed at the upper surface of the semiconductor substrate,
a first conductivity type body region formed at a side and a lower surface side of the emitter region and in contact with an emitter electrode,
a second conductivity type IGBT drift region formed on a lower surface side of the body region,
a first conductivity type collector region formed on a lower surface side of the IGBT drift region, and
a gate electrode facing a range of the body region via an insulating film, wherein the range of the body region separates the emitter region from the IGBT drift region,
the IGBT drift region comprises an IGBT drift layer and a buffer layer which has a higher density of second conductivity type impurities than the IGBT drift layer,
a low impurity region is formed between the cathode region and the collector region at a lower surface of the semiconductor substrate,
the low impurity region comprises at least one of a first conductivity type first low impurity region which has a lower density of first conductivity impurities than that in the collector region and a second conductivity type second low impurity region which has a lower density of second conductivity impurities than that in the cathode region, and
the lower drift layer and the buffer layer are continuous with each other on an upper side of the low impurity region.

2. The semiconductor device according to claim 1, further comprising an electrode in contact with the lower surface of the semiconductor substrate, wherein
the cathode region, the collector region and the low impurity region are exposed at the lower surface of the semiconductor substrate, and
a contact resistance of the low impurity region and the electrode is higher than both of a contact resistance of the cathode region and the electrode and a contact resistance of the collector region and the electrode.

3. The semiconductor device according to claim 1, wherein
a boundary between the cathode region and the low impurity region is located on a diode region side from a position under the body region of the IGBT region in a plan view of the semiconductor device.

4. The semiconductor device according to claim 1, wherein
a lifetime control region is formed in the diode drift region,
a lifetime of a carrier in the lifetime control region is shorter than that in the diode drift region outside the lifetime control region, and
an IGBT region side end of the lifetime control region is located above the low impurity region in a plan view of the semiconductor device.

5. The semiconductor device according to claim 1, wherein
a first conductivity type separation region is formed in a range between the diode region and the IGBT region and extending from the upper surface of the semiconductor substrate to a position deeper than both of a lower end of the anode region and a lower end of the body region, and
an IGBT region side end of a lifetime control region is located under the separation region in a plan view of the semiconductor device.

6. A method for manufacturing the semiconductor device according to claim 1, the method comprising:
a masking step of disposing a mask on one of a lower surface side of a diode forming region and a lower surface side of an IGBT forming region of a semiconductor wafer;
an ion doping step of doping impurity ions from a lower surface side of the mask to a lower surface of the semiconductor wafer and forming an ion doping region; and
an annealing step of annealing the ion doping region; wherein
the ion doping step comprises:
a first ion doping step of doping the impurity ions in a first direction from a region on which the mask has been formed in the masking step to a region on which the mask was not formed, the first direction making an acute angle with the lower surface of the semiconductor wafer, and
a second ion doping step of doping the impurity ions in a second direction which intersects with the first direction.

7. A method for manufacturing the semiconductor device according to claim 1, the method comprising:
a masking step of disposing a mask on one of a lower surface side of a diode forming region and a lower surface side of an IGBT forming region of a semiconductor wafer,
an ion doping step of doping impurity ions from a lower surface side of the mask to a lower surface of the semiconductor wafer and forming an ion doping region, and
a laser annealing step of performing laser annealing of the ion doping region with the mask being disposed.

8. The method according to claim 6 for manufacturing the semiconductor device, wherein
the mask is fixed in the masking step with the semiconductor wafer via a bond layer which is in contact with the lower surface of the semiconductor wafer.

9. A method for manufacturing the semiconductor device according to claim 1, the method comprising:
a masking step of disposing a mask on one of a lower surface side of a diode forming region and a lower surface side of an IGBT forming region of a semiconductor wafer,
an ion doping step of doping impurity ions from a lower surface side of the mask to a lower surface of the semiconductor wafer and forming the first conductivity type collector region and the second conductivity type cathode region, which are adjacent to each other, and a laser annealing step of performing laser annealing of a boundary between the collector region and the cathode region in the lower surface of the semiconductor wafer.

10. The method according to claim 6 for manufacturing the semiconductor device wherein the mask is disposed on the lower surface side of the IGBT forming region of the semiconductor wafer in the masking step, and the method further comprises a crystal defect forming step of irradiating charged particles from the lower surface side of the mask to the lower surface of the semiconductor wafer and forming the crystal defect in the diode forming region of the semiconductor wafer.

\* \* \* \* \*